United States Patent
Tsubata et al.

(10) Patent No.: US 11,475,931 B2
(45) Date of Patent: Oct. 18, 2022

(54) MAGNETORESISTIVE MEMORY DEVICE

(71) Applicant: Kioxia Corporation, Tokyo (JP)

(72) Inventors: Shuichi Tsubata, Kuwana Mie (JP); Naoki Akiyama, Seoul (KR)

(73) Assignee: KIOXIA CORPORATION, Tokyo (JP)

(*) Notice: Subject to any disclaimer, the term of this patent is extended or adjusted under 35 U.S.C. 154(b) by 77 days.

(21) Appl. No.: 17/016,212

(22) Filed: Sep. 9, 2020

(65) Prior Publication Data
US 2021/0287727 A1 Sep. 16, 2021

(30) Foreign Application Priority Data
Mar. 13, 2020 (JP) .............................. JP2020-043774

(51) Int. Cl.
| | | |
|---|---|---|
| G11C 11/00 | (2006.01) | |
| G11C 11/16 | (2006.01) | |
| H01L 43/08 | (2006.01) | |
| H01L 43/12 | (2006.01) | |
| H01L 43/10 | (2006.01) | |
| H01L 43/02 | (2006.01) | |

(52) U.S. Cl.
CPC ............ *G11C 11/161* (2013.01); *H01L 43/02* (2013.01); *H01L 43/08* (2013.01); *H01L 43/10* (2013.01); *H01L 43/12* (2013.01)

(58) Field of Classification Search
CPC ....... G11C 11/161; H01L 43/02; H01L 43/08; H01L 43/10; H01L 43/12
USPC ......................................... 365/158, 171, 173
See application file for complete search history.

(56) References Cited

U.S. PATENT DOCUMENTS

| | | | |
|---|---|---|---|
| 7,932,513 B2 * | 4/2011 | Hosotani | H01L 27/22 |
| | | | 365/158 |
| 8,981,502 B2 | 3/2015 | Chen et al. | |
| 9,093,632 B2 | 7/2015 | Tsubata et al. | |
| 9,397,289 B2 | 7/2016 | Tsubata | |
| 9,508,922 B2 | 11/2016 | Yoshikawa et al. | |
| 9,570,671 B2 | 2/2017 | Yoshikawa et al. | |

(Continued)

FOREIGN PATENT DOCUMENTS

| | | | | |
|---|---|---|---|---|
| JP | 2013143548 A | | 7/2013 | |
| JP | 2014179639 A | * | 9/2014 | ........... G11C 11/155 |
| JP | 5710743 B2 | | 3/2015 | |

OTHER PUBLICATIONS

U.S. Appl. No. 16/816,398; First Named Inventor: Shuichi Tsubata; Title: "Magnetoresistive Memory Device and Method of Manufacturing Magnetoresistive Memory Device", filed Mar. 12, 2020.

*Primary Examiner* — Viet Q Nguyen
(74) *Attorney, Agent, or Firm* — Holtz, Holtz & Volek PC

(57) ABSTRACT

According to one embodiment, a magnetoresistive memory device includes: a first conductor; a layer stack; an insulator on a side surface of the layer stack; a second conductor on a second surface of the layer stack; a third conductor; and a fourth conductor on the third conductor. The layer stack includes a first ferromagnetic layer, a second ferromagnetic layer, and an insulating layer between the first ferromagnetic layer and the second ferromagnetic layer and has a first surface in contact with the first conductor. The second surface is at an opposite side of the first surface. The third conductor has a portion on the second conductor and a portion on a side surface of the insulator.

14 Claims, 23 Drawing Sheets

(56) References Cited

U.S. PATENT DOCUMENTS

| | | |
|---|---|---|
| 9,595,663 B2 | 3/2017 | Yoshikawa et al. |
| 9,698,338 B2 | 7/2017 | Yoshikawa et al. |
| 9,741,929 B2 | 8/2017 | Guo |
| 10,020,444 B2 | 7/2018 | Tsubata et al. |
| 10,147,761 B2 | 12/2018 | Yoshikawa et al. |
| 10,177,302 B2 | 1/2019 | Tsubata et al. |
| 10,193,057 B2 | 1/2019 | Yoshikawa et al. |
| 10,230,042 B2 | 3/2019 | Yoshikawa et al. |
| 10,388,854 B2 | 8/2019 | Yoshikawa et al. |
| 10,388,855 B2 | 8/2019 | Tsubata et al. |
| 10,461,245 B2 | 10/2019 | Tsubata et al. |
| 10,490,732 B2 | 11/2019 | Sonoda et al. |
| 10,600,955 B2 * | 3/2020 | Sonoda ................ H01L 27/228 |
| 11,145,345 B2 * | 10/2021 | Tsumita .................. H01L 43/14 |
| 2015/0069558 A1 * | 3/2015 | Nakayama .............. H01L 43/08 257/421 |
| 2015/0295170 A1 | 10/2015 | Tsubata et al. |
| 2016/0064653 A1 * | 3/2016 | Seto ........................ H01L 43/08 257/421 |
| 2016/0072047 A1 * | 3/2016 | Seto ........................ H01L 43/08 257/421 |
| 2016/0072055 A1 | 3/2016 | Seto et al. |
| 2016/0104834 A1 * | 4/2016 | Toko ....................... H01L 43/12 257/421 |
| 2019/0006580 A1 | 1/2019 | Yoshikawa et al. |
| 2019/0280187 A1 * | 9/2019 | Sonoda ................ H01L 27/228 |
| 2020/0083288 A1 * | 3/2020 | Kanaya .................. H01L 43/08 |
| 2020/0083290 A1 | 3/2020 | Tsubata et al. |
| 2020/0091411 A1 * | 3/2020 | Sonoda .................. H01L 43/12 |
| 2020/0294566 A1 | 9/2020 | Tsubata |
| 2021/0249590 A1 * | 8/2021 | Komura .................. H01L 29/82 |

\* cited by examiner

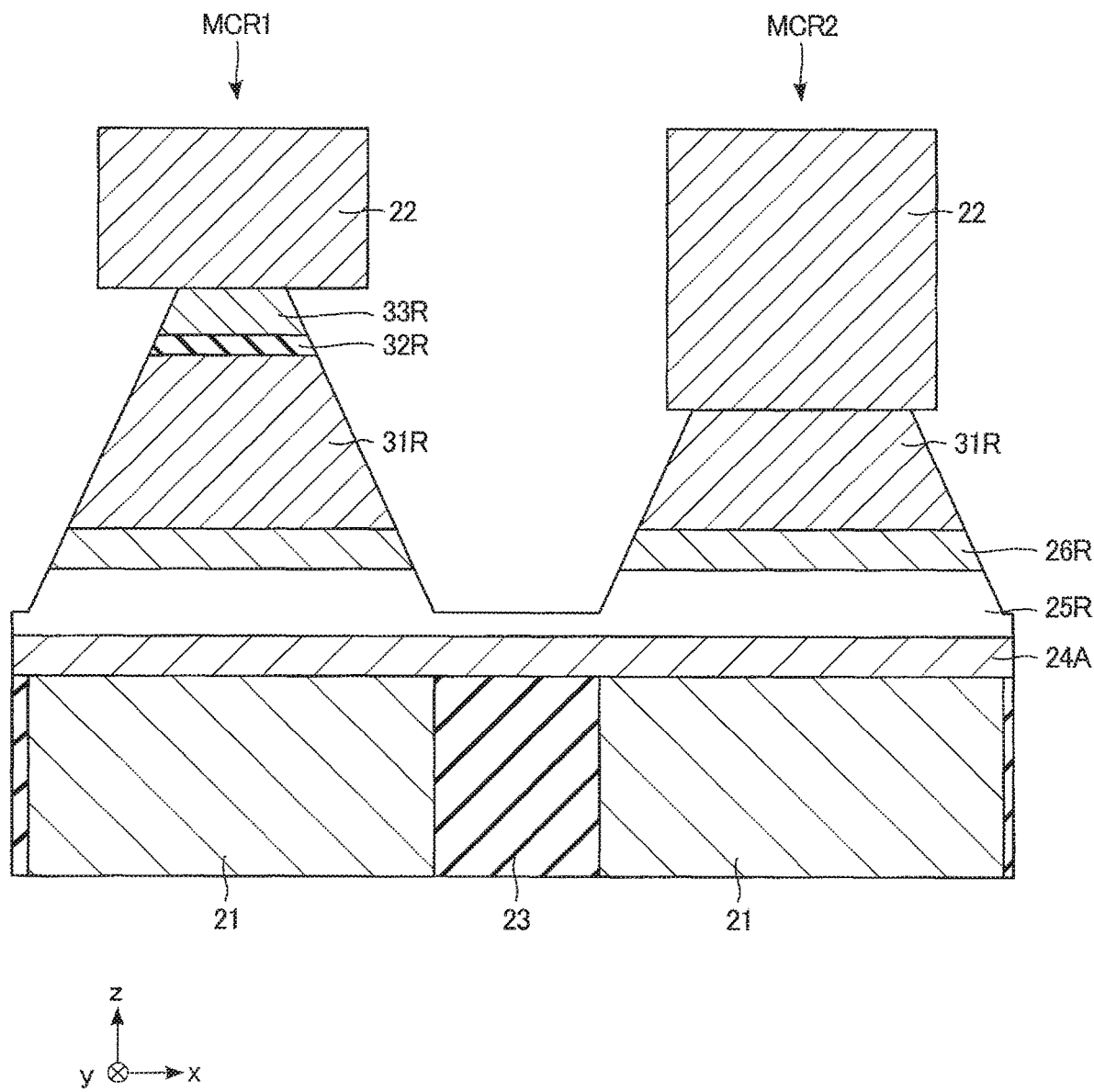
F I G. 15

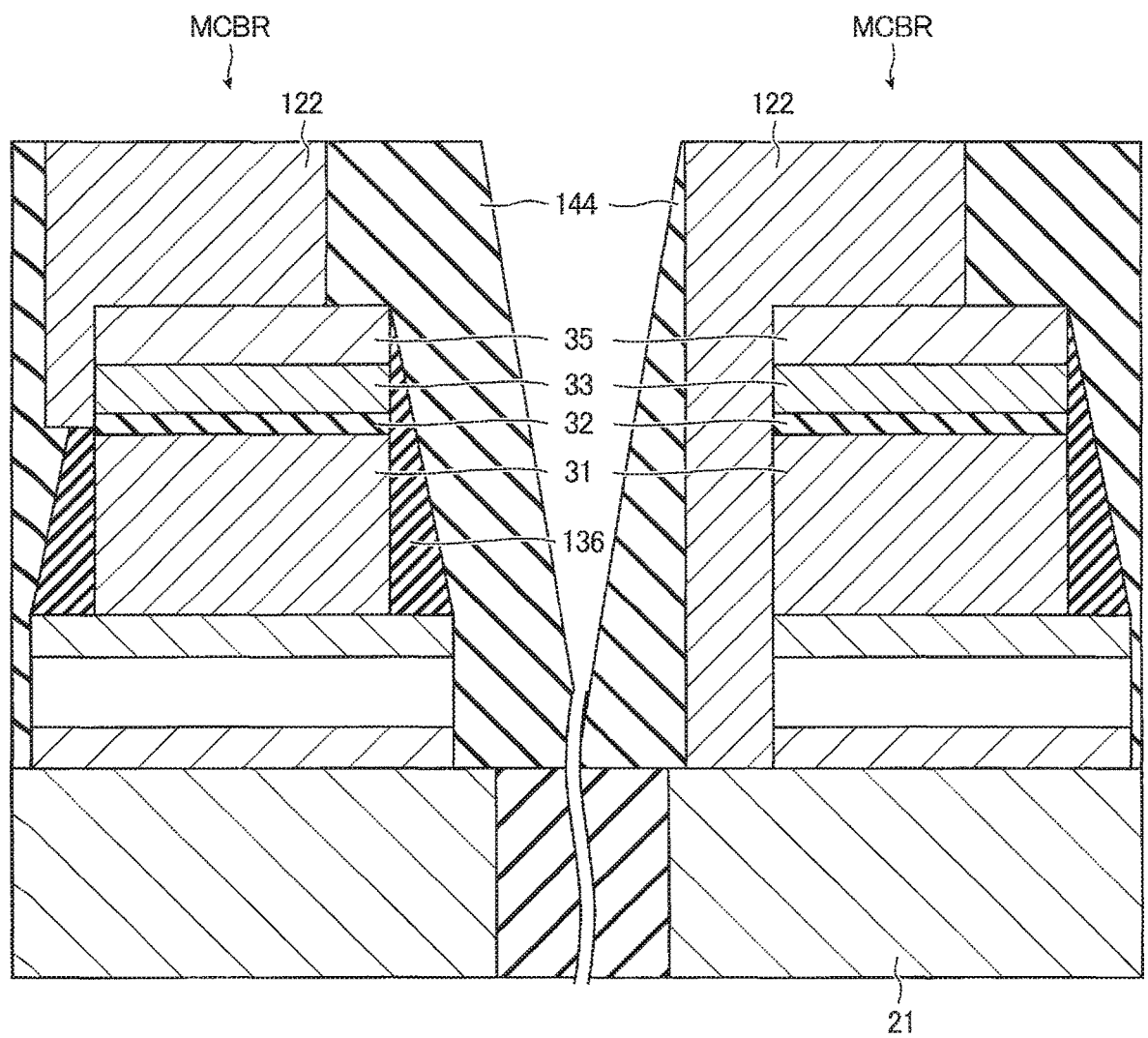
F I G. 22

MAGNETORESISTIVE MEMORY DEVICE

CROSS-REFERENCE TO RELATED APPLICATIONS

This application is based upon and claims the benefit of priority from Japanese Patent Application No. 2020-043774, filed Mar. 13, 2020, the entire contents of which are incorporated herein by reference.

FIELD

Embodiments described herein relate generally to a magnetoresistive memory device.

BACKGROUND

A memory device using a magnetoresistance effect element is known.

BRIEF DESCRIPTION OF THE DRAWINGS

FIG. 15 shows the structure of the magnetoresistive memory device for reference at a time point subsequent to FIG. 14;

FIG. 22 shows the structure of a magnetoresistive memory device for reference.

DETAILED DESCRIPTION

Figure 1:
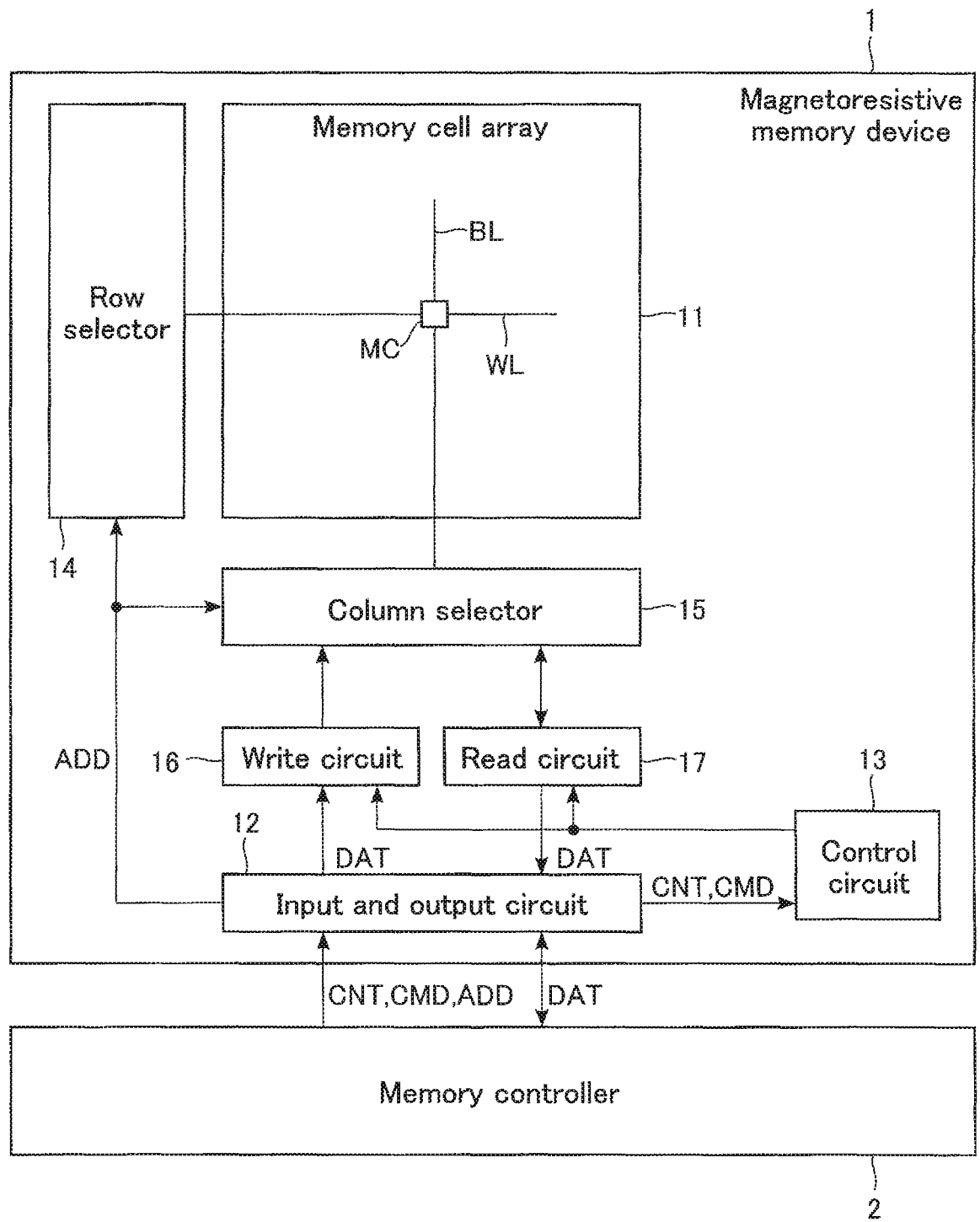
FIG. 1 shows functional blocks of a magnetoresistive memory device according to a first embodiment.

In general, according to one embodiment, a magnetoresistive memory device includes: a first conductor; a layer stack; an insulator on a side surface of the layer stack; a second conductor on a second surface of the layer stack; a third conductor; and a fourth conductor on the third conductor. The layer stack includes a first ferromagnetic layer, a second ferromagnetic layer, and an insulating layer between the first ferromagnetic layer and the second ferromagnetic layer and has a first surface in contact with the first conductor. The second surface is at an opposite side of the first surface. The third conductor has a portion on the second conductor and a portion on a side surface of the insulator.

Embodiments will now described with reference to the figures. In the following description, components with substantially the same functionalities and configurations will be referred to with the same reference numerals, and repeated descriptions may be omitted. Numbers or characters are sometimes used after the letters of reference symbols to distinguish between components that have substantially the same structure and substantially the same functionalities.

The figures are schematic, and the relations between the thickness and the area of a plane of a layer and ratio of thicknesses of layers may differ from actual ones. Moreover, the figures may include components which differ in relations and/or ratios of dimensions in different figures. The entire description for a particular embodiment also applies to another embodiment unless explicitly mentioned otherwise or obviously eliminated. Each embodiment shows the device and method for materializing the technical idea of that embodiment, and the technical idea of an embodiment does not specify the quality of the material, shape, structure, arrangement of components, etc. to the following.

In the specification and the claims, a phrase of a particular first component being "coupled" to another second component includes the first component being coupled to the second component either directly or via one or more components which are always or selectively conductive.

The embodiments will be described by using an xyz orthogonal coordinate system. In the description below, the term "below" as well as terms derived therefrom and terms related thereto refer to a position having a smaller coordinate on the z-axis, and the term "above" as well as terms derived therefrom and terms related thereto refer to a position having a larger coordinate on the z-axis.

1. First Embodiment

1.1. Structure (Configuration)

1.1.1. Overall Structure

FIG. 1 shows functional blocks of the magnetoresistive memory device according to the first embodiment. As shown in FIG. 1, a magnetoresistive memory device 1 includes a memory cell array 11, an input and output circuit 12, a control circuit 13, a row selector 14, a column selector 15, a write circuit 16, and a read circuit 17.

The memory cell array 11 includes memory cells MC, word lines WL, and bit lines BL. The memory cell MC can store data in a non-volatile manner. Each memory cell MC is coupled to one word line WL and one bit line BL. Each word line WL is associated with a row. Each bit line BL is associated with a column. Selection of one row and selection of one or more columns specify one or more memory cells MC.

The input and output circuit 12 receives various types of a control signal CNT, various types of a command CMD, an address signal ADD, and data (write data) DAT, for example, from a memory controller 2, and transmits data (read data) DAT to, for example, the memory controller 2.

The row selector 14 receives the address signal ADD from the input and output circuit 12 and brings one word line WL associated with the row that is specified by the received address signal ADD into a selected state.

The column selector 15 receives the address signal ADD from the input and output circuit 12 and brings bit lines BL associated with the column that is specified by the received address signal ADD into a selected state.

The control circuit 13 receives the control signal CNT and the command CMD from the input and output circuit 12. The control circuit 13 controls the write circuit 16 and the read circuit 17 based on control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages used for data writing to the column selector 15 based on the control by the control circuit 13 and the write data DAT.

The read circuit 17 includes a sense amplifier, and based on the control of the control circuit 13, uses the voltages used for data reading to determine data stored in the memory cells MC.

1.1.2. Circuit Configuration of Memory Cell Array

Figure 2:
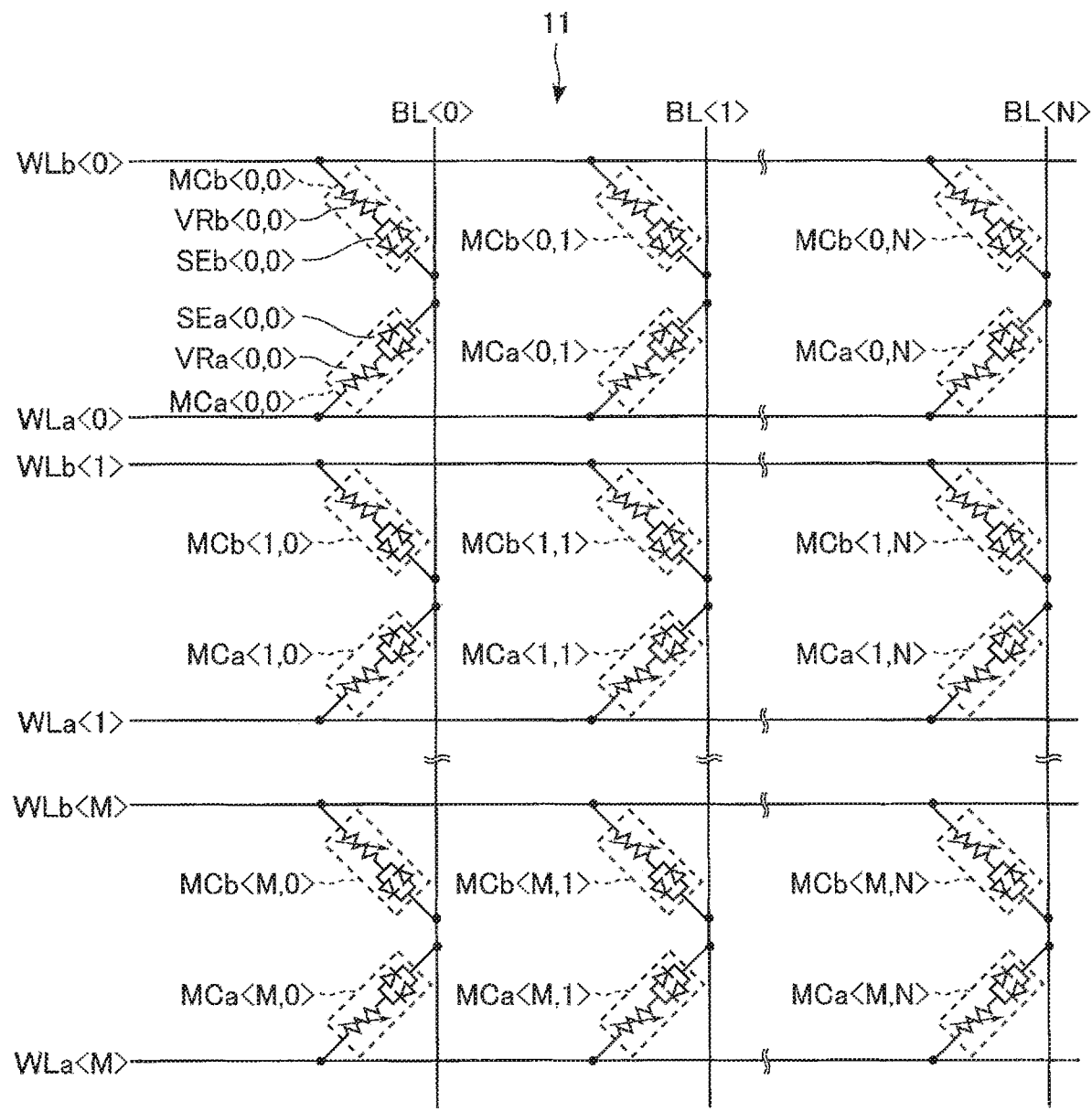
FIG. 2 is a circuit diagram of a memory cell array according to the first embodiment.

FIG. 2 is a circuit diagram of a memory cell array 11 according to the first embodiment. As shown in FIG. 2, the memory cell array 11 includes (M+1) word lines WLa (WLa<0>, WLa<1>, . . . , and WLa<M>) and (M+1) word lines WLb (WLb<0>, WLb<1>, . . . , and WLb<M>), where M is a natural number. The memory cell array 11 also includes (N+1) bit lines BL (BL<0>, BL<1>, . . . , and BL<N>), where N is a natural number.

Each of the memory cells MC (MCa and MCb) includes two nodes: a first node coupled to one word line WL; and a second node coupled to one bit line BL. More specifically the memory cells MCa encompass memory cells MCa<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N, and the memory cell MCa<$\alpha$, $\beta$> is coupled between the word line WLa<$\alpha$> and the bit line BL<$\beta$>. Similarly, the memory cells MCb encompass memory cells MCb<$\alpha$, $\beta$> for all combinations of $\alpha$ and $\beta$, where a is every integer equal to or greater than 0 and equal to or less than M, and $\beta$ is every integer equal to or greater than 0 and equal to or less than N, and the memory cell MCh<$\alpha$, $\beta$> is coupled between the word line WLb<$\alpha$> and the bit line BL<$\beta$>.

Each memory cell MC includes one magnetoresistance effect element VR (VRa or VRb) and one switching element SE (SEa or SEb). More specifically, the memory cell MCa<$\alpha$, $\beta$> includes a magnetoresistance effect element VRa<$\alpha$, $\beta$> and a switching element SEa<$\alpha$, $\beta$> for all combinations of $\alpha$ and $\beta$, where a is every integer equal to or greater than 0 and equal to or less than M, and $\beta$ is every integer equal to or greater than 0 and equal to or less than N. Moreover, each memory cell MCb<$\alpha$, $\beta$> includes a magnetoresistance effect element VRb<$\alpha$, $\beta$> and a switching element SEb<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N.

In each memory cell MC, the magnetoresistance effect element VR and the switching element SE are coupled in series. The magnetoresistance effect element VR is coupled to one word line WL, and the switching element SE is coupled to one bit line BL.

The magnetoresistance effect element VR is capable of switching between a low-resistance state and a high-resistance state. The magnetoresistance effect element VR is capable of storing 1-bit data, utilizing the difference in the two resistance states.

The switching element SE may be a switching element as described below, for example. The switching element includes two terminals, and, when a voltage smaller than a first threshold is applied in a first direction between the two terminals, the switching element is in a high-resistance state, i.e., electrically non-conductive (in an off state). On the other hand, when a voltage equal to or greater than a first threshold is applied in the first direction between the two terminals, the switching element is in a low-resistance state, for example, electrically conductive (in an on state). The switching element is further equipped with a function similar to the function of switching between the high-resistance state and the low-resistance state based on the magnitude of the voltage applied in the first direction, with respect to a second direction opposite to the first direction. By turning on or off the switching element, it is possible to perform control as to whether or not to supply a current to a magnetoresistance effect element VR coupled to the switching element, namely, whether or not to select the magnetoresistance effect element VR.

1.1.3. Structure of Memory Cell Array

Figure 3:
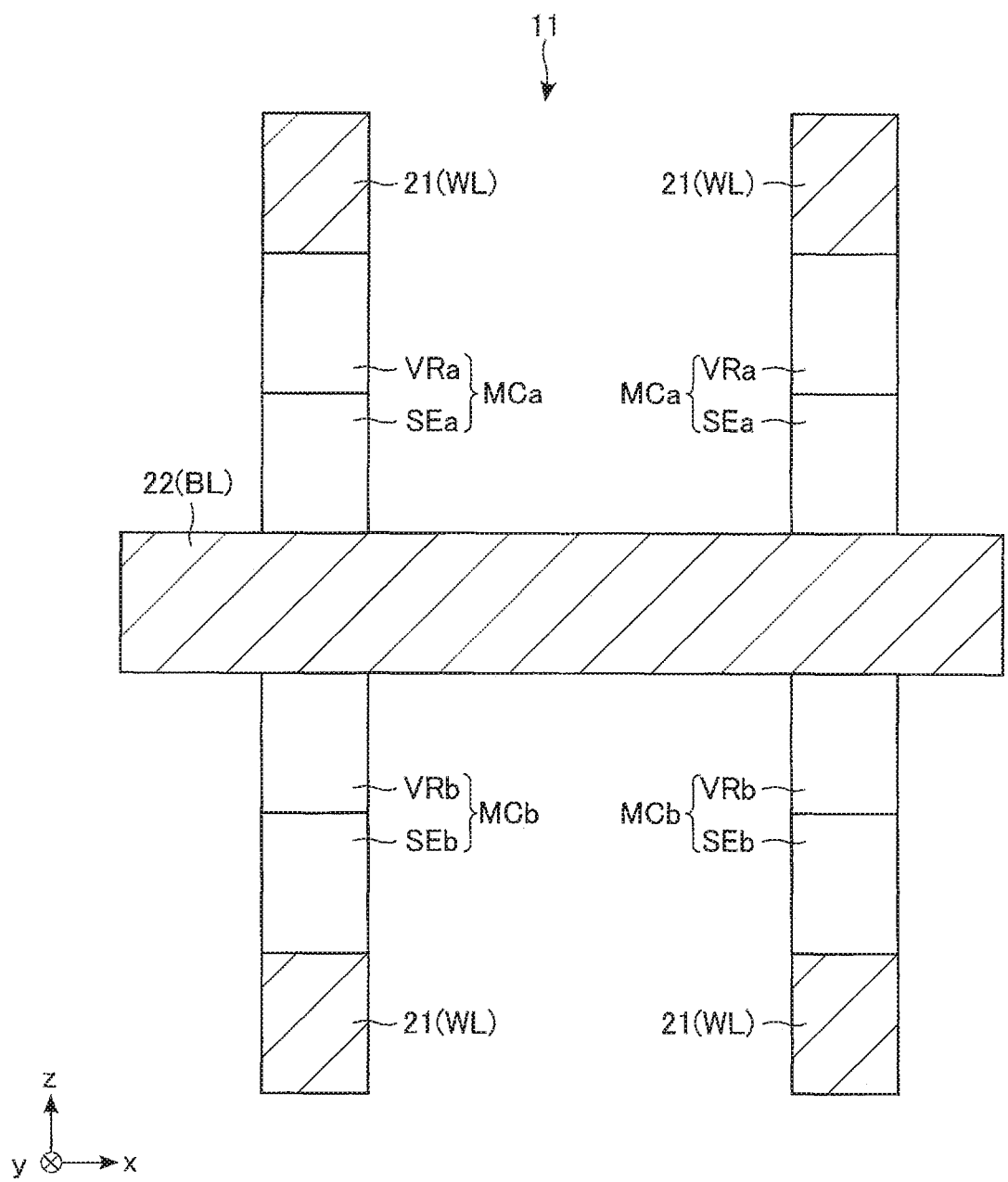
FIG. 3 shows a cross-section structure of part of the memory cell array according to the first embodiment.

FIG. 3 shows a cross-section structure of a part of the memory cell array 11 of the first embodiment.

As shown in FIG. 3, a plurality of conductors 21 are provided above a semiconductor substrate (not shown). The conductors 21 extend along the y-axis, and are aligned along the x-axis. Each conductor 21 functions as one word line WL.

Each conductor 21 is coupled, at its top surface, to the bottom surfaces of a plurality of memory cells MCb. Each memory cell MCb has, for example, a circular shape in the x-y plane. The memory cells MCb are aligned along the y-axis on each conductor 21, and this arrangement provides a matrix of memory cells MCb. Each memory cell MC includes a structure that functions as a switching element SE and another structure that functions as a magnetoresistance effect element VR. The structure that functions as a switching element SE and the structure that functions as a magnetoresistance effect element VR each have one or more layers, as will be described later.

A plurality of conductors 22 are provided above the memory cells MCb. The conductors 22 extend along the x-axis and are aligned along the y-axis. Each conductor 22 is coupled, at its bottom surface, to the top surfaces of a plurality of memory cells MCb aligned along the x-axis. Each conductor 22 functions as one bit line BL.

Each conductor 22 is coupled, at its top surface, to the bottom surfaces of a plurality of memory cells MCa. Each memory cell MCa has, for example, a circular shape in the x-y plane. The memory cells MCa are aligned along the x-axis on each conductor 22, and this arrangement provides a matrix of Memory cells MCa. A further conductor 21 is provided on the top surfaces of the memory cells MCa aligned along the y-axis. The memory cell array 11 as shown in FIG. 2 can be realized y repeatedly providing the structure from the lower-most layer of conductor 21 to the layer of memory cells MCa shown in FIG. 2 along the z-axis.

The memory cell array 11 further includes an inter-layer insulator in a region where the conductors 21, conductors 22, and memory cells MC are not provided.

1.1.4. Structure of Memory Cell

Figure 4:
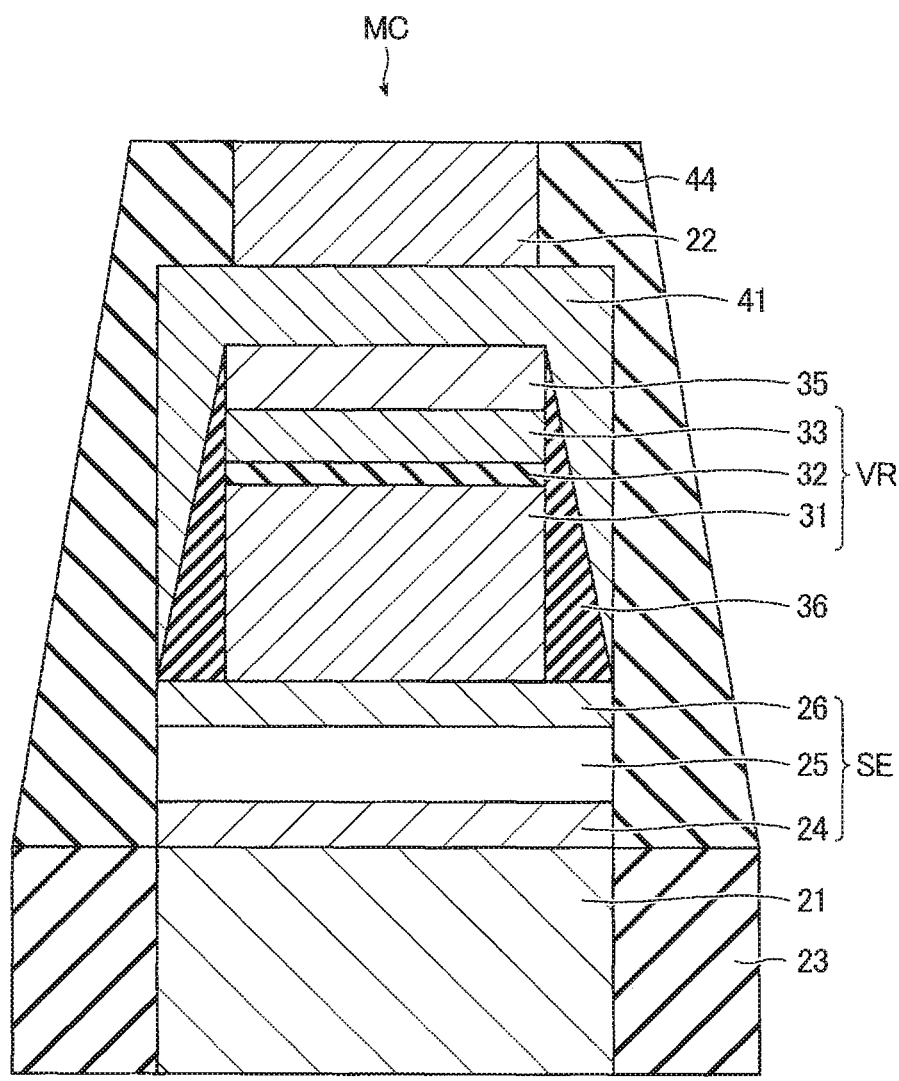
FIG. 4 shows a cross section of an exemplary structure of the memory cell according to the first embodiment.

FIG. 4 shows a cross section of an exemplary structure of the memory cell MC according to the first embodiment. As shown in FIG. 4, a conductor 21 (word line WL) is provided in an inter-layer insulator 23. A memory cell MC is provided on the top surface of the conductor 21. The memory cell MC includes a switching element SE, a magnetoresistance effect element VR on the switching element SE, a first hard mask 35, and a second hard mask 41.

The switching element SE includes a variable resistive material 25. The switching element SE may further include a lower electrode 24 and an upper electrode 26. The following description is based on this example.

The variable resistive material 25 is, for example, a switching element between two terminals, the first of the two terminals corresponding to one of the top surface and bottom surface of the variable resistive material 25, the second of the two terminals corresponding to the other one of the top surface and bottom surface of the variable resistive material 25. When a voltage applied between the two terminals is smaller than a threshold, the switching element is in a "high resistance" state, or, for example electrically non-conductive. When a voltage applied between the two terminals is greater than or equal to the threshold, the switching element becomes a "low resistance" state, or, for example, electrically conductive. The variable resistive material 25 includes at least one kind of chalcogen element selected from a group consisting of tellurium (Te), selenium (Se), and sulfur (S). Alternatively, the variable resistive material 25 may include chalcogenide, which is a compound including the above-described chalcogen element.

The magnetoresistance effect element VR exhibits a tunneling magnetoresistance effect, and includes a magnetic tunnel junction (MTJ). Specifically, the magnetoresistance effect element VR includes a ferromagnetic layer 31, an insulating layer 32, and a ferromagnetic layer 33. The magnetoresistance effect element may be referred to as an MTJ element. For example, as shown in FIG. 4, the insulating layer 32 is on the top surface of the ferromagnetic layer 31, and the ferromagnetic layer 33 is on the top surface of the insulating layer 32.

The ferromagnetic layer 31 has an easy magnetization axis along a direction penetrating interfaces between the ferromagnetic layer 31, the insulating layer 32, and the ferromagnetic layer 33, such as an easy magnetization axis at an angle from 45° to 90° with respect to the interfaces, or an easy magnetization axis along a direction orthogonal to the interfaces. The direction of magnetization of ferromagnetic layer 31 is intended to remain unchanged even when data is read or written in the magnetoresistive memory device 1. The ferromagnetic layer 31 can function as a so-called reference layer. The ferromagnetic layer 31 may include a plurality of layers.

The insulating layer 32 either contains or is made of, for example, magnesium oxide (MgO), and functions as a so-called "tunnel barrier".

The ferromagnetic layer 33 either contains or is made of, for example, cobalt iron boron (CoFeB) or iron boride (FeB). The ferromagnetic layer 33 has an easy magnetization axis along a direction penetrating interfaces between the ferromagnetic layer 31, insulating layer 32, and ferromagnetic layer 33, such as an easy magnetization axis at an angle from 45° to 90° with respect to the interfaces, or an easy magnetization axis along a direction orthogonal to the interfaces. The magnetization direction of ferromagnetic layer 33 can be changed by data writing, and the ferromagnetic layer 33 can function as a so-called "storage layer".

When the magnetization direction of ferromagnetic layer 33 is parallel to the magnetization direction of ferromagnetic layer 1, the magnetoresistance effect element VR is in a state of having a lower resistance. When the magnetization direction of ferromagnetic layer 33 is anti-parallel to the magnetization direction of ferromagnetic layer 31, the magnetoresistance effect element VR is in a state of having a higher resistance.

When a certain magnitude of write current flows from the ferromagnetic layer 33 to the ferromagnetic layer 31, the magnetization direction of ferromagnetic layer 33 becomes parallel to the magnetization direction of ferromagnetic layer 31. In contrast, when another magnitude of write current flows from the ferromagnetic layer 31 to the ferromagnetic layer 33, the magnetization direction of ferromagnetic layer 33 becomes anti-parallel to the magnetization direction of ferromagnetic layer 31.

The first hard mask 35 is positioned on the top surface of the magnetoresistance effect element IR, for example, on the top surface of the ferromagnetic layer 33. The first hard mask 35 is made of a conductor.

The side surface of the insulating layer 32 is covered with a side-wall insulator 36. In addition, the side surfaces of layers of the magnetoresistance effect element VR other than the insulating layer 32 out of the magnetoresistance effect element VR may be covered with the de-wall insulator 36. As an example, the side surface of the magnetoresistance effect element VR and the side surface of the first hard mask 35 are covered with the side-wall insulator 36. Each side surface of the side-wall insulator 36 is tapered, and the diameter of the side-wall insulator 36 along the x-y plane at its upper end is smaller than the diameter along the x-y plane at its lower end. The lower end of the side surface of the side-wall insulator 36 is substantially aligned with or is positioned further outside than the upper end of the side surface of the switching element SE, for example the upper end of the side surface of the upper electrode 26. The side-wall insulator 36 includes, for example, a silicon nitride or is made of a silicon nitride.

The side surface of the side-wall insulator 36 and the top surface of the first hard mask 35 are covered with the second hard mask 41. The second hard mask 41 needs to be in non-contact with the upper electrode 26, variable resistive material 25, and lower electrode 24. The lower end of the side surface of the second hard mask 41 may be located at any portion of the side surface of the side-wall insulator 36, provided that the second hard mask 41 is not in contact with the upper electrode 26, variable resistive material 25 and lower electrode 24. However, when the edge of the second hard mask 41 in the X-Y plane is positioned further inside than the lower end of the side surface of the side-wall insulator 36 (a portion that is in contact with an upper electrode 26A), the intervals between the memory cells MC can be narrower. FIG. 4 shows an example where the lower end of the side surface of the second hard mask 41 substantially coincides with the position of the lower end of the side surface of the side-wall insulator 36.

The second hard mask 41 has conductivity. The second hard mask 41 includes one or more of or is made of scandium (Sc), titanium (Ti), yttrium (Y), zirconium (Zr), niobium (Nb), molybdenum (Mo), ruthenium (Ru), hafnium (Hf), tantalum (Ta), and tungsten (W). Specifically, the second hard mask 41 may be an alloy containing Sc, Ti, Y, Zr, Nb, Mo, Ru, Hf, Ta, or W. Alternatively, the second hard mask 41 is made of one or more of respective nitrides of Sc, Ti, Y, Zr, Nb, Mo, Ru, Hf, Ta, and W.

Alternatively, the second hard mask 41 is made of one or more of respective borides of Sc, Ti, Y, Zr, Nb, Mo, Ru, Hf, Ta, and W.

The conductor 22 (bit line BL) is positioned on the top surface of the second hard mask 41.

The side surface of the switching element SE, the side surface and the top surface of the second hard mask 41, and the side surface of the conductor 22 are covered with an insulator 44. The insulator 44 includes or is made of, for example, a silicon nitride. Alternatively, the insulator 44 may include or be made of a silicon oxide.

1.2 Manufacturing Method

FIGS. 5 to 13 sequentially show structures of part of the magnetoresistive memory device according to the first embodiment at some stages during its manufacturing process.

Figure 5:
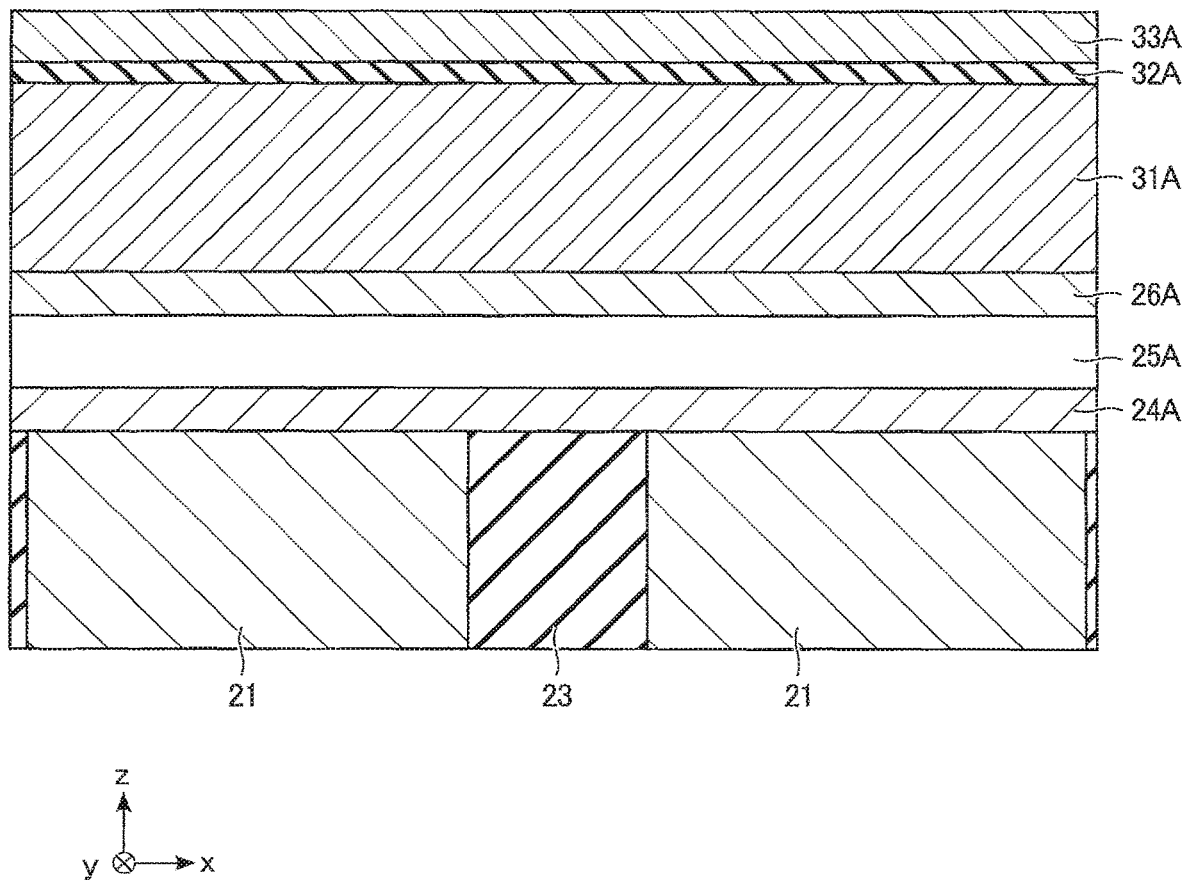
FIGS. 5 to 13 sequentially show structures of part of the magnetoresistive memory device according to the first embodiment at some stages during a manufacturing process.

As shown in FIG. 5, a plurality of conductors (word lines WL) are formed in an inter-layer insulator 23. Next, a lower electrode 24A, a variable resistive material 25A, an upper electrode 26A, a ferromagnetic layer 31A, an insulating layer 32A, and a ferromagnetic layer 33A are deposited in this order on the top surface of the inter-layer insulator 23 and the top surfaces of the conductors 21. The lower electrode 24A, variable resistive material 25A, upper electrode 26A, ferromagnetic layer 31A, insulating layer 32A and ferromagnetic layer 33A are components to be formed into a lower electrode 24, variable resistive material 25, an upper electrode 26, ferromagnetic layer 31, an insulating layer 32, and a ferromagnetic layer 33, respectively, in subsequent steps.

Figure 6:
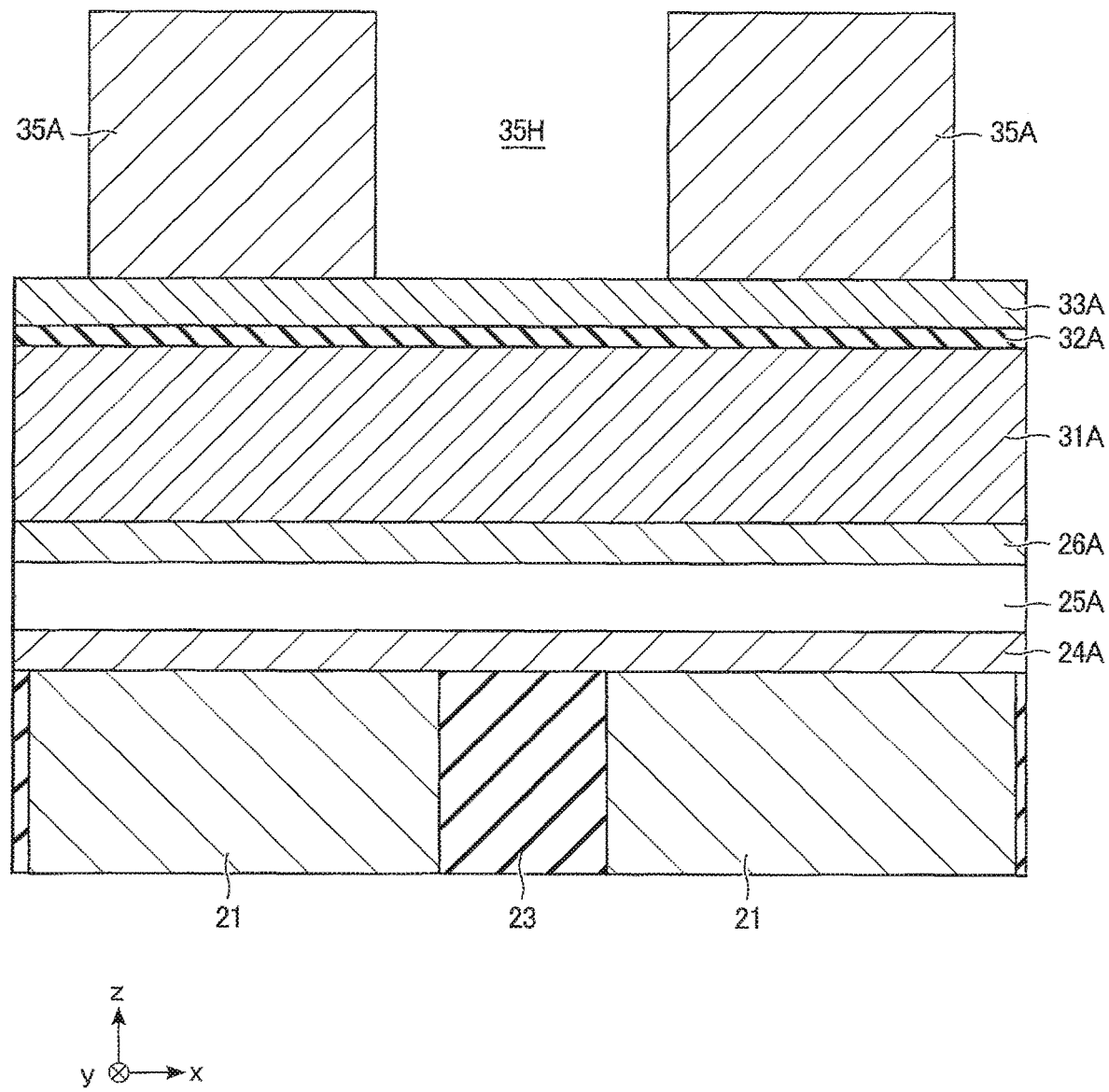

As shown in FIG. 6, a first hard mask 35A is formed on the top surface of the ferromagnetic layer 33A. The first hard mask 35A is a component which will become a first hard mask 35 in subsequent steps. The first hard mask 35A remains above regions in which memory cells MC are to be formed and has, in the remaining regions, openings 35H which penetrate the first hard mask 35A from its top surface through its bottom surface.

Figure 7:
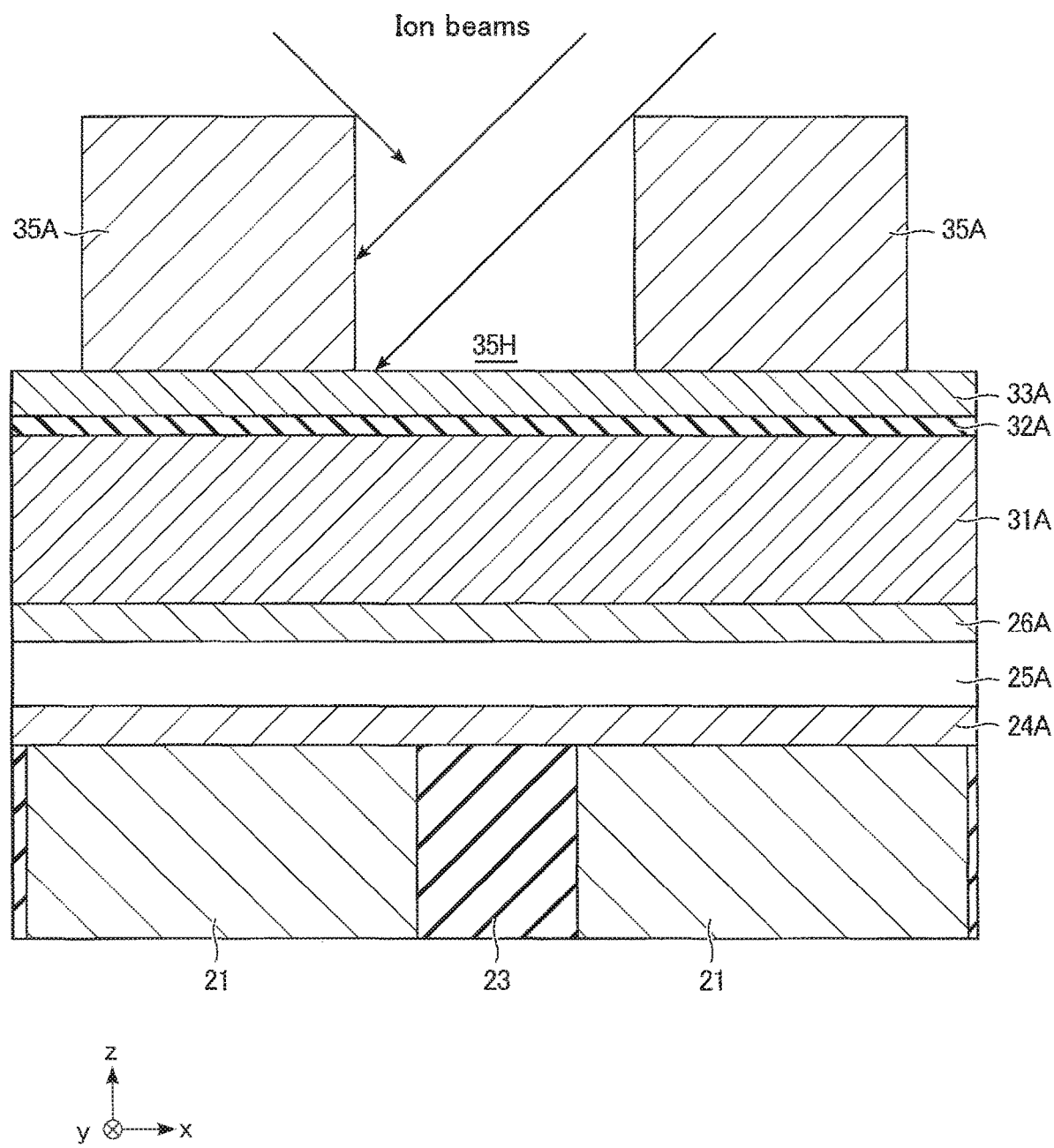

As shown in FIG. 7, the structure that obtained through the steps so far is etched by ion beam etching (IBE). Each ion beam has an angle with respect to the z-axis. Such ion beams intrude into the opening 35H of the first hard mask 35A and partially remove the components exposed inside the opening 35H. Some ion beams are blocked by the first hard mask 35A and do not reach a deep region inside the opening 35H. However, the first hard mask 35A is partially removed by the IBE, and the top surface of the first hard mask 35A becomes lower in height with the progress of the IBE. As a result, the ion beams become able to reach the deeper region inside the opening 35H with the progress of the IBE. Therefore, the ferromagnetic layer 31A, insulating layer 32A and ferromagnetic layer 33A are etched at their portions inside the opening 35H due to the progress of the IBE.

Figure 8:
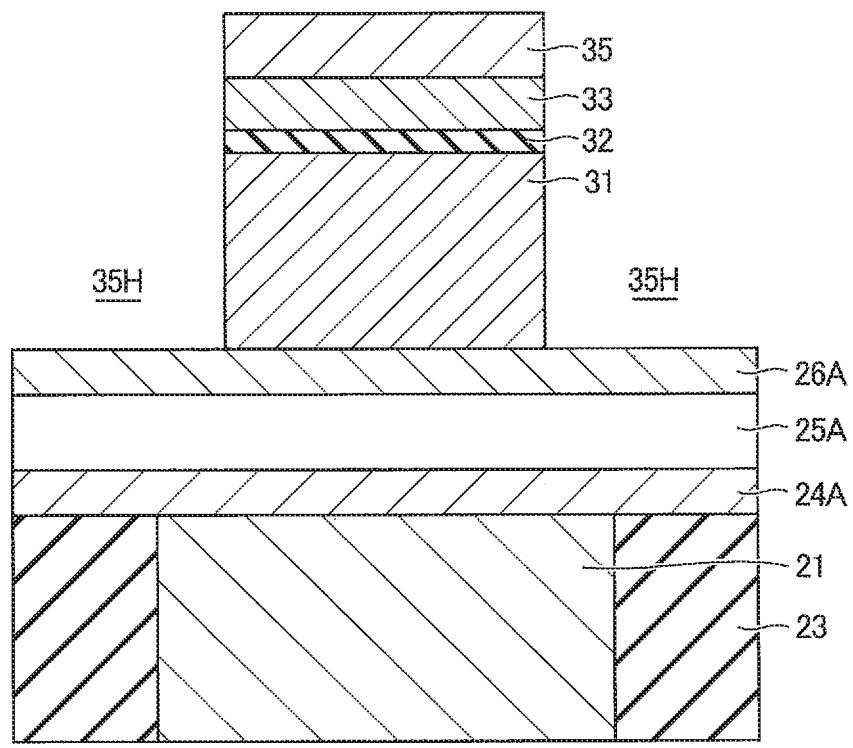

As shown in FIG. 8, by the IBE of FIG. 7 being continued, the ferromagnetic layer 31A, insulating layer 32A, and ferromagnetic layer 33A are respectively formed into a ferromagnetic layer 31, an insulating layer 32, and a ferromagnetic layer 33. An upper electrode 26A is partially exposed in the openings 35H of the first hard mask 35A. The first hard mask 35A becomes the first hard mask 35 due to the decrease in height of the top surface thereof.

Figure 9:
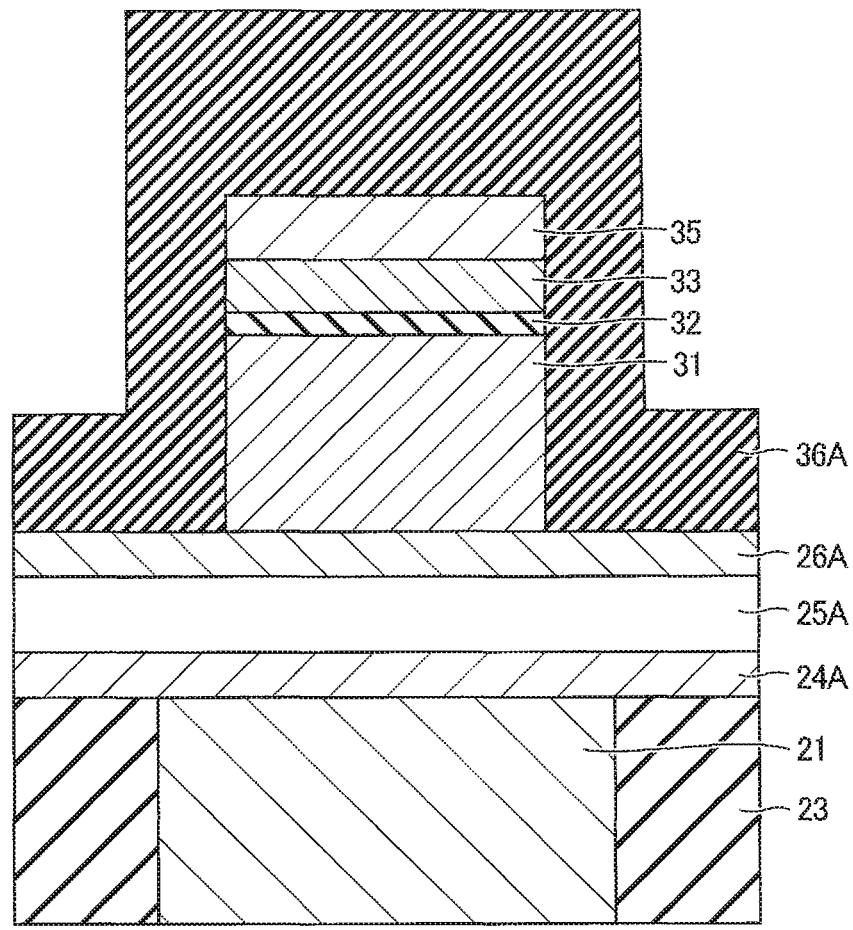

As shown in FIG. 9, a side-wall insulator 36A is deposited on the entire top surface of the structure obtained through the steps so far. The side-wall insulator 36A is a component which will be formed into a side-wall insulator 36 in subsequent steps. The side-wall insulator 36A covers exposed portions of the top surface of the upper electrode 26A, respective side surfaces of the ferromagnetic layer 31, insulating layer 32, ferromagnetic layer 33, and first hard mask 35, and the top surface of the first hard mask 35.

Figure 10:
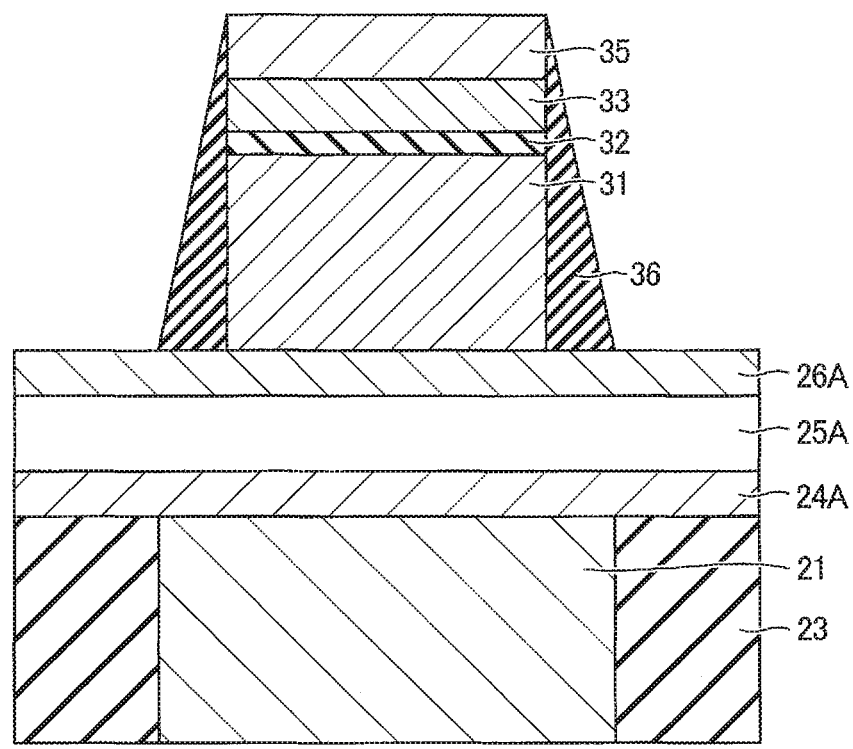

As shown in FIG. 10, the side-wall insulator 36A is subjected to etch-back and thereby the side-wall insulator 36A is formed into a side-wall insulator 36. That is, by etching back, the portion on the upper surface of the first hard mask 35 of the sidewall insulator 36A is removed. Also, the portion of the side-wall insulator 36A on respective side surfaces of the ferromagnetic layer 31, insulating layer 32, ferromagnetic layer 33 and first hard mask 35 are thinned by the etch-back. Furthermore, portion of the side-wall insulator 36A on the top surface of the upper electrode 26A is partially removed. As a result, the top surface of the upper electrode 26A is partially exposed.

Figure 11:
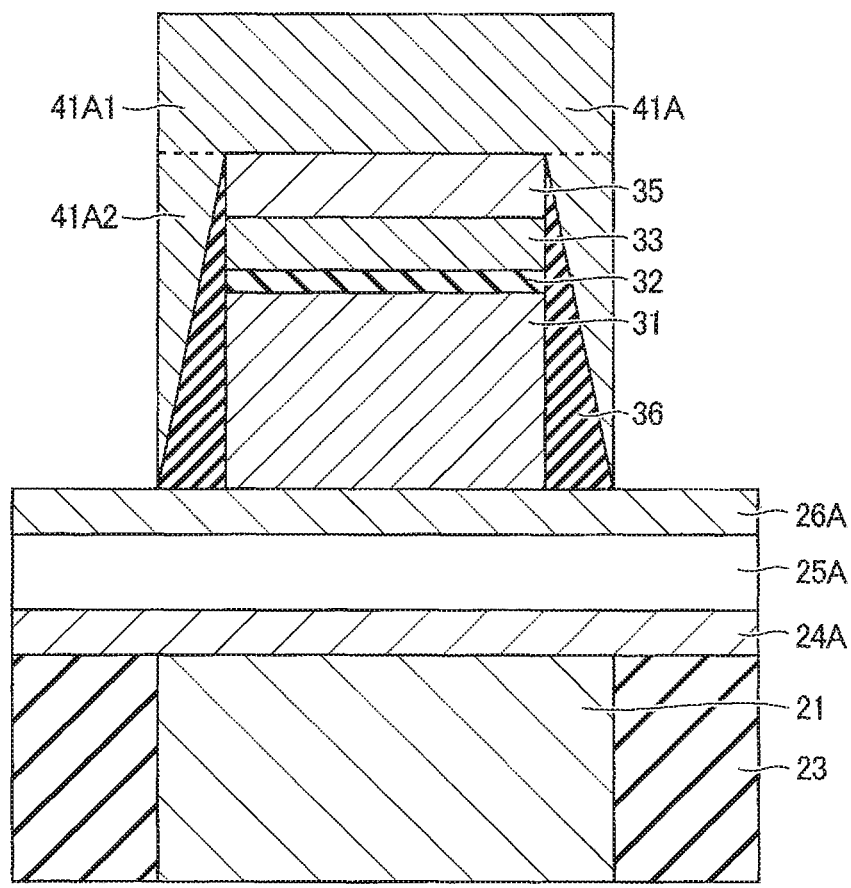

As shown in FIG. 11, a second hard mask 41A is formed on the side surface of the side-wall insulator 36 and the top surface of the first hard mask 35. The second hard mask 41A is a component which will become a second hard mask 41 in subsequent steps. In a portion 41A1 of the top surface of the first hard mask 35, the second hard mask 41A is thicker than a portion 41A2 on the side surface of the side-wall insulator 36. In particular, the width or diameter of the second hard mask 41A along the x-y plane is preferably smaller, and the edge of the second hard mask 41A is preferably positioned at least at the same portion of the lower ends (portions which are in contact with the upper electrode 26A) of the side surface of the side-wall insulator 36 or further inside than the side-wall insulator 36. The reason why the width or diameter of the second hard mask 41A along the x-y plane is small is that the second hard mask 41A is used for formation of the lower electrode 24A, variable resistive material 25A, and upper electrode 26A, and each width or diameter of the lower electrode 24 and the variable resistive material 25, and the portion 41A2 along the x-y plane is desired to be small for a high-density arrangement of the memory cells MC. On the other hand, the reason why the portion 41A1 is made thick is that the portion 41A1 preferably remains even if the top surface of the portion 41A1 lowers in height by etching of the lower electrode 24A, variable resistive material 25A, and upper electrode 26A in subsequent steps.

Such a second hard mask 41A is formed by, for example, a method in which a target layer is not formed conformally. Such a method of forming target layer non-conformally includes sputtering, for example. By using the non-conformal formation, the second hard mask 41A becomes thicker, in portion of the top surface of the first hard mask 35, than in portions of the side surface of the side-wall insulator 36.

Figure 12:
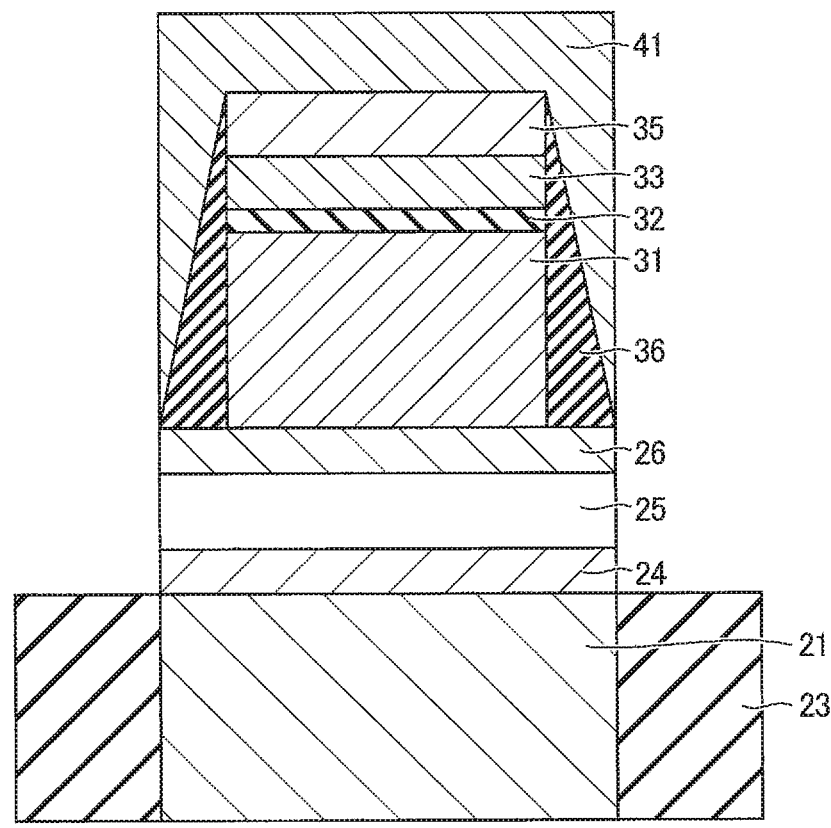

As shown in FIG. 12, the structure obtained through the steps so far is etched using the second hard mask 41A as a mask. When the width or diameter of the second hard mask 41A along the x-y plane is positioned further inside than the lower end of the side surface of the side-wall insulator 36, the side-wall insulator 36 can also function as a mask. The etching can be performed by, for example, anisotropic etching such as reactive ion etching (RIE). The lower electrode 24A, variable resistive material 25A, and upper electrode 26A are partially removed by etching and are formed into a lower electrode 24, a variable resistive material 25, and an upper electrode 26, respectively. In addition, the second hard mask 41A is subjected to etch-back at its top surface by the etching to become a second hard mask 41.

Figure 13:
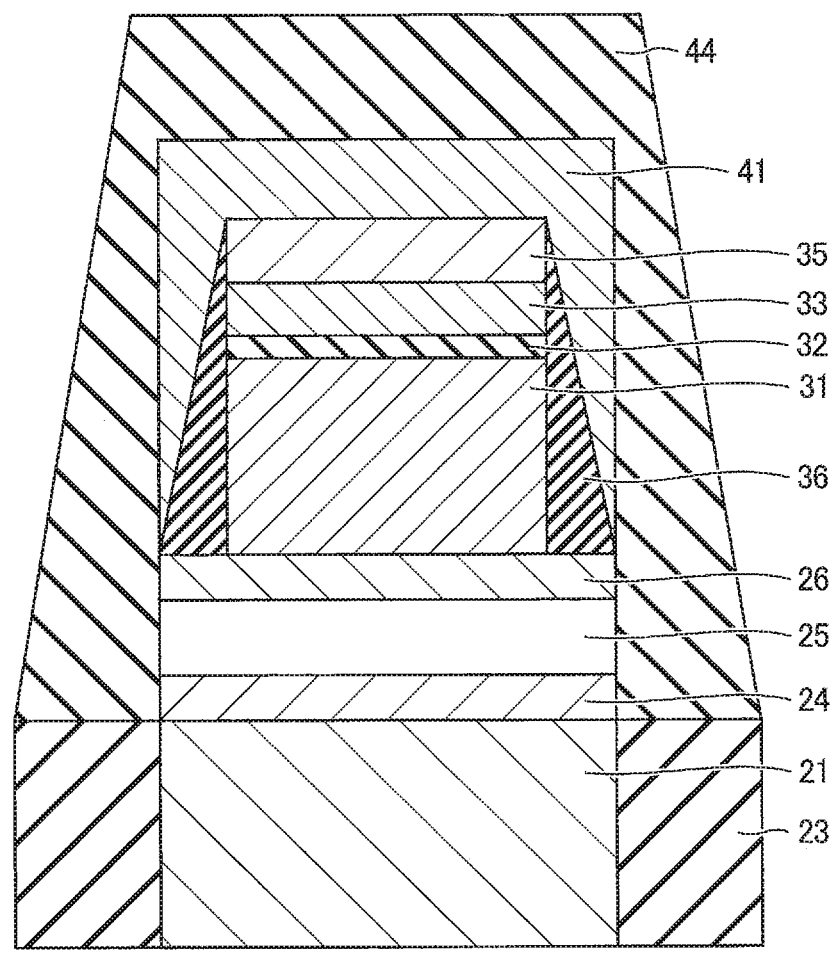

As shown in FIG. 13, an insulator 44 is formed on the entire top surface of the structure obtained through the steps so far. The insulator 44 covers respective side surfaces of the lower electrode 24, the variable resistive material 25, the upper electrode 26, and the second hard mask 41, and the top surface of the second hard mask 41.

As shown in FIG. 4, a region of the insulator 44 in which a conductor 22 is to be formed is removed, and the conductor 22 is formed in the removed region.

1.3 Advantages (Effects)

According to the first embodiment, it is possible to provide a magnetoresistive memory device 1 including memory cells MC that can be highly densely arranged as described below.

Figure 14:
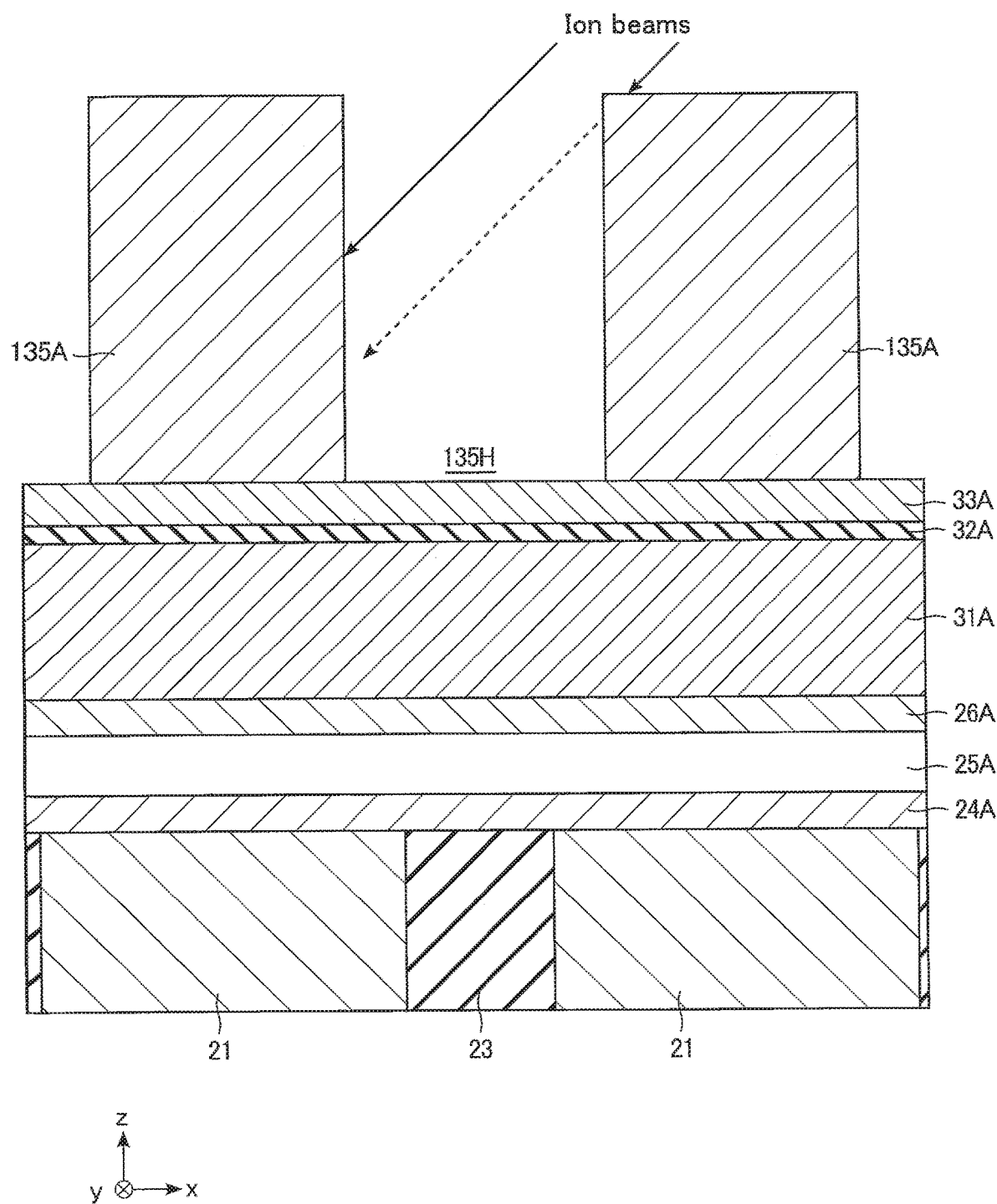
FIG. 14 shows the structure of a magnetoresistive memory device for reference at a time point during a manufacturing process.

FIGS. 14 and 15 sequentially show structures of a magnetoresistive memory device for reference in states during its manufacturing process.

FIG. 14 corresponds to the step of FIG. 7 of the first embodiment. The hard mask 135A remains in the regions in which memory cells MC are to be formed, similarly to the first hard mask 35A of the first embodiment. On the other hand, the hard mask 135A has a higher aspect ratio than that of the first hard mask 35A. The reason for this is to use the hard mask 135A also in the formation of the lower electrode 24A, variable resistive material 25A, and upper electrode 26A, and to avoid the hard masks 135A from being etched off by IBE fore completion of the formation, in contrast to the first embodiment. When the hard mask 135A is thick for the purpose of forming a hard mask 135A having a high aspect ratio, the asp ratio of an opening 135H is also high.

When the opening 135H has a high aspect ratio, it is difficult for ion beams to reach the ferromagnetic layer 33A, insulating layer 32A, ferromagnetic layer 31A, upper electrode 26A, variable resistive material 25A and upper electrode 24A, in contrast to the steps of FIGS. 7 and 8 of the first embodiment.

Since it is difficult for ion beams to reach the ferromagnetic layer 33A, insulating layer 32A, ferromagnetic layer 31A, upper electrode 26A, variable resistive material 25A, and upper electrode 24A, the structure shown in FIG. 15 may be formed. FIG. 15 shows a structure following FIG. 14 and corresponds to the step of FIG. 4 of the first embodiment. However, FIG. 15 omits illustrating components corresponding to the side-wall insulator 36 and the insulator 44 in FIG. 4. A ferromagnetic layer 33R, an insulating layer 32R, a ferromagnetic layer 31R, an upper electrode 26R, and a variable resistive material 25R are components made by forming the ferromagnetic layer 33A, insulating layer 32A, ferromagnetic layer 31A, upper electrode 26A, and a variable resistive material 25A, respectively.

Since it is difficult for ion beams to reach a deep position in the opening 135H of the hard mask 135A, the ferromagnetic layer 33A, insulating layer 32A, ferromagnetic layer 31A, upper electrode 26A, and variable resistive material 25A are not etched properly. For example, it requires time to etch the components that are located at lower positions, and the components that have been already formed and are located at upper positions are excessively etched. For this reason, the area along the x-y plane (the x-y plane area) of the ferromagnetic layer 33R, insulating layer 32R, ferromagnetic layer 31R, etc., is a smaller than intended size. Therefore, like the memory cell MCR1, the area of a region in which the ferromagnetic layer 33 is in contact with the conductor 22 is small, and the resistance at the contacted region is high. In addition, when forming a hole for the conductor 22 in an insulator corresponding to the insulator 44, some components may be etched unintentionally. For example, the process of forming a hole removes the ferromagnetic layer 33R and insulating layer 32R of the memory cell MCR2 unintentionally. Such a memory cell MCR2 cannot function as a memory cell.

In addition, since etching of components of etching targets requires time, the hard mask 135A may be etched off unintentionally before the etching of the etching target components ends, even if the hard mask 135 has a high aspect ratio when formed. As a result, there are cases where a portion for the memory cell MCR1 and a portion for the memory cell MCR2 are not separated from each other as they are in the variable resistive material 25R. Furthermore, the lower electrode 24A positioned at a further lower position is not etched at all. Such memory cells MCR1 and MCR2 do not function as memory cells.

In order to suppress these phenomena, reducing the aspect ratio of the opening 1353 can be considered. However, this means broadening the intervals of the memory cells MC and as a result, the memory cells MC are prevented from being highly densely arranged.

According to the first embodiment, the second hard mask 41 is provided between the first hard mask 35 and the conductor 22. The second hard mask 41 is used for formation of the lower electrode 24A, variable resistive material 25A, and upper electrode 26A. Therefore, the first hard mask 35A need not have a high aspect ratio. This allows ion beams to reach a deeper region in the opening 35H of the first hard mask 35A, and the ferromagnetic layer 33A, insulating layer 32A, and ferromagnetic layer 31A to be etched in a shorter time than in the case of the manufacturing process for reference. Thereby, it is possible to prevent the ferromagnetic layer 33A, insulating layer 32A, and ferromagnetic layer 31A from being excessively etched and to prevent the x-y plane area of the ferromagnetic layer 33 from being excessively reduced. This prevents the generation of a high resistance at the top surface of the ferromagnetic layer 33. In addition, the prevention of excessive reduction in the x-y plane area of the ferromagnetic layer 33 prevents the ferromagnetic layer 33 from being removed by the etching for forming a hole for the conductor 22 in the insulator 44. Furthermore, the second hard mask 41 itself protects the ferromagnetic layer 33 against the etching for forming the opening 135H.

Also, the second hard mask 41 covers the magnetoresistance effect element VR, the first hard mask 35, and the side-wall insulator 35. Therefore, the second hard mask 41 has a larger x-y plane area than the x-y plane area of the first hard mask 35, which means that a high volume conductor is positioned between the first hard mask 35 and the conductor 22. Therefore, the resistance between the first hard mask 35 and the conductor 22 is smaller than in the case of the magnetoresistive memory device for reference.

By means of the configuration described above, the ferromagnetic layer 33A, insulating layer 32A, ferromagnetic layer 31A, upper electrode 26A, variable resistive material 25A, and lower electrode 24A can be formed, even if the aspect ratio of the opening 35H of the first hard mask 35A is lower than that of the hard mask 135A for reference. Therefore, according to the first embodiment, memory cells MC which operate normally can be highly densely arranged.

2. Second Embodiment

The second embodiment is similar to the first embodiment in respect to structure, and differs in respect to the material of certain elements from the first embodiment. In the other respects, the second embodiment is identical to the first embodiment. Hereinafter, a description will mainly be given of the points different from the first embodiment among the configuration of the second embodiment.

2.1. Structure

Figure 16:
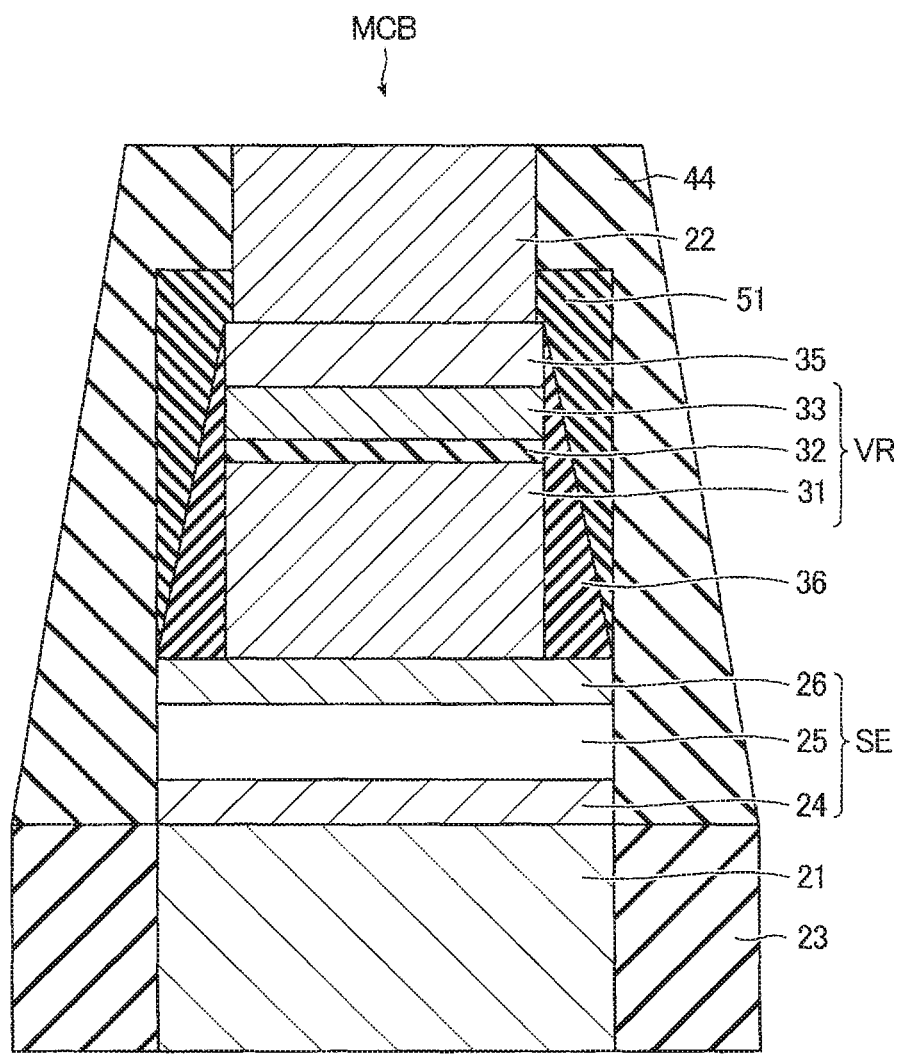
FIG. 16 shows a cross section of an exemplary structure of a memory cell according to a second embodiment.

FIG. 16 shows a cross section of an exemplary structure of a memory cell MC according to the second embodiment. The memory cell MC of the second embodiment may be referred to as "memory cell MCB" for distinction from the memory cell MC of the first embodiment.

The memory cell MCB includes a second hard mask 51 instead of the second hard mask 41 in the memory cell MC. The second hard mask 51 covers the side surface of a side-wall insulator 36 and also covers part of the top surface of the first hard mask 35, and in particular, a portion including an edge of the first hard mask 35 along the edge. The lower end of the side surface of the second hard mask 51 may be located at any portion of the side surface of the side-wall insulator 36. However, when the edge of the second hard mask 51 in the x-y plane is positioned further inside than the lower end of the side surface of the side-wall insulator 36 (the portions which are in contact with the upper electrode 26A), the intervals of the memory cells MCB can be narrower. Therefore, the edge of the second hard mask 51 in the x-y plane can be positioned further inside than the lower end of the side surface of the side-wall insulator 36, FIG. 16 shows an example where the lower end of the side surface of the second hard mask 51 substantially coincides with the position of the lower end of the side surface of the side-wall insulator 36. The second hard mask 51 is not provided at part of the top surface of the first hard mask 35, and in particular, in a region including the center of the top surface of the first hard mask 35. Part of the conductor 22 is provided in the region where the second hard mask 51 is not provided, and the conductor 22 and the first hard mask 35 are in contact with each other inside this region.

The second hard mask 51 is insulative and includes or is made of an insulator. In addition, the second hard mask 51 includes or is made of a material different from the material of the insulator 44 and side-wall insulator 36, and in particular, a material which is etched at a different etching rate than those of the insulator 44 and side-wall insulator 36 for various types of etching. Specifically, where the insulator 44 and side-wall insulator 36 include or are made of a silicon nitride, the second hard mask 51 may include or be made of a silicon oxide.

2.2. Manufacturing Method

FIGS. 17 to 21 sequentially show structures of part of the magnetoresistive memory device according to the second embodiment at some stages during its manufacturing process.

Figure 17:
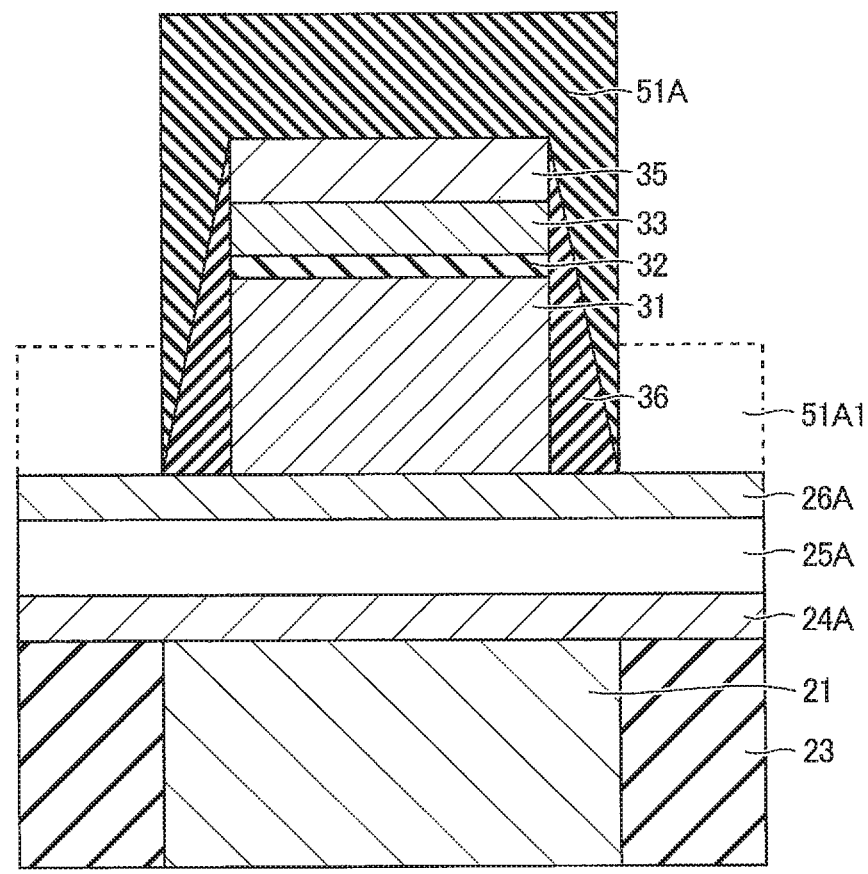
FIGS. 17 to 21 sequentially show structures of part of the magnetoresistive memory device according to the second embodiment at some stages during part of a manufacturing process.
Figure 17:
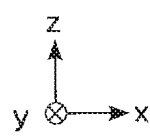

First, the steps of FIGS. 5 to 10 of the first embodiment are performed. Next, as shown in FIG. 17, a second hard mask 51A is formed on the side surface of the side-wall insulator 36 and the top surface of the first hard mask 35. The second hard mask 51A is a component which will become a second hard mask 51 through subsequent steps. Unlike the second hard mask 41 of the first embodiment, the second hard mask 51A may be made thicker or thinner, in portion of the top surface of the first hard mask 35, than in portion on the side surface of the side-wall insulator 36.

The second hard mask 51A can be formed by any method. For example, the second hard mask 51A including a portion 51A1 on the top surface of an upper electrode 26A as shown by a broken line in FIG. 17 is formed first, and then the portion 51A1 can be removed by etch-back. Alternatively, the second hard mask 51A may be formed by a method and/or under conditions in which the portion 51A1 is not formed from the beginning.

Particularly when the edge of the second hard mask 51A in the x-y plane is positioned further inside than the lower end of the side surface of the side-wall insulator 36, the intervals of the memory cells MCB can be narrower.

Figure 18:
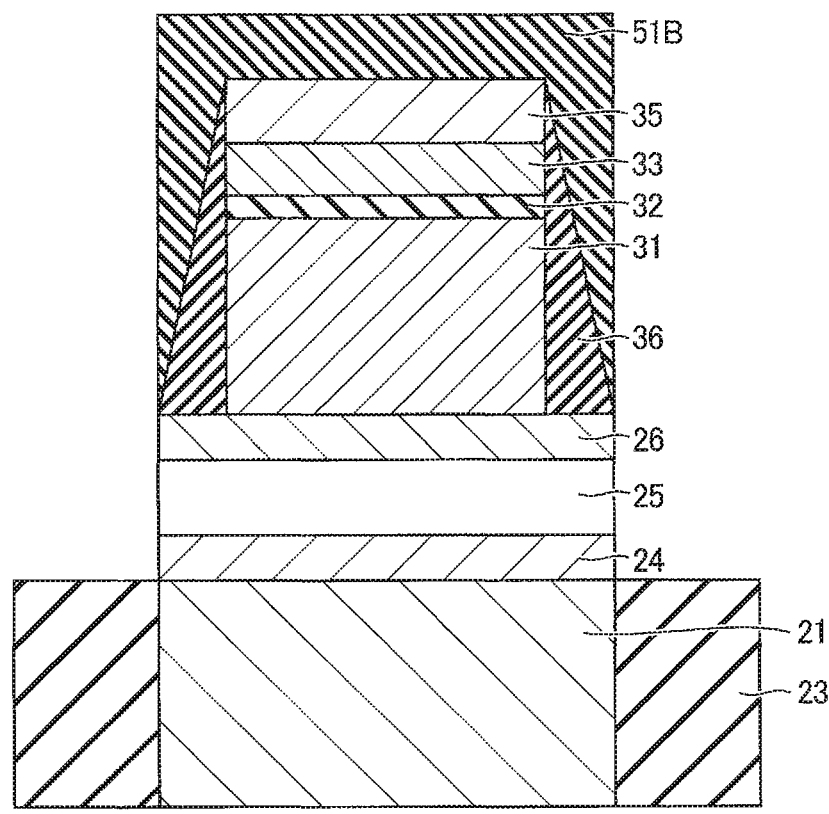

As shown in FIG. 18, the structure obtained through the steps so far is etched using the second hard mask 51A as a mask, similarly to FIG. 12 of the first embodiment. When the edge of the second hard mask 51A in the x-y plane is positioned further inside than the lower ends of the side surface of the side-wall insulator 36, the side-wall insulator 36 can also function as a mask. The etching can be performed by, for example, anisotropic etching such as RIE. The etching forms the lower electrode 24, variable resistive material 25 and upper electrode 26. In addition, the second hard mask 51A is subjected to etch-back at its top surface by the etching to become a second hard mask 51B.

Figure 19:
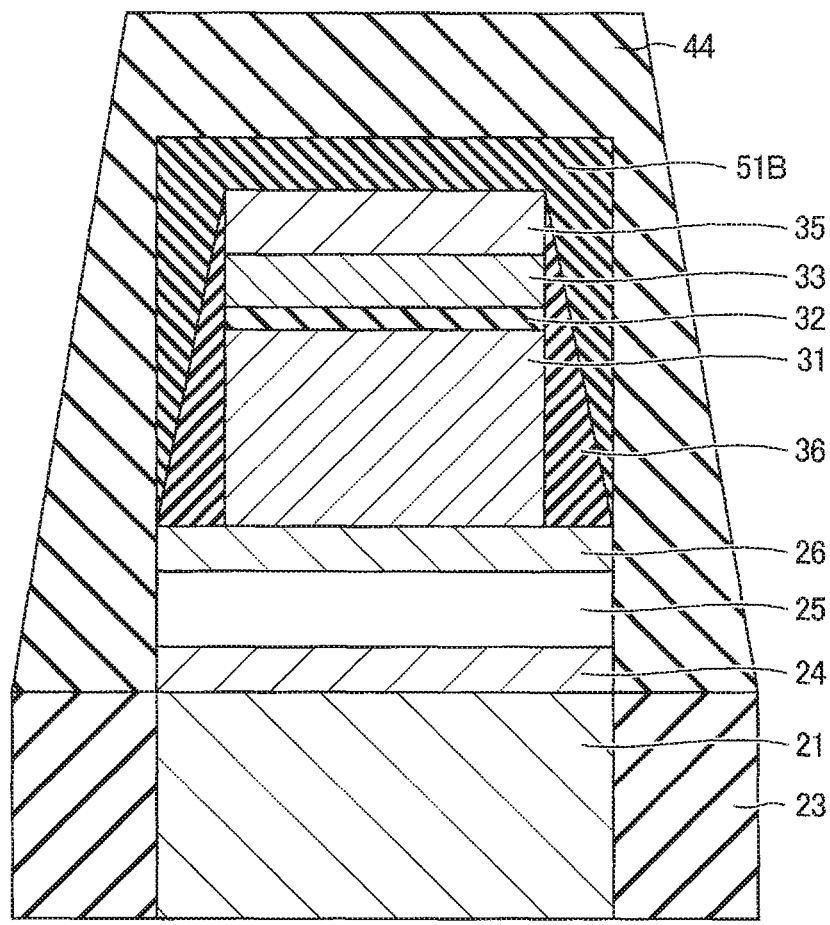

As shown in FIG. 19, an insulator 44 is formed on the entire top surface of the structure obtained through the steps so far. The insulator 44 covers respective side surfaces of the lower electrode 24, variable resistive material 25, upper electrode 26, and second hard mask 51 and the top surface of the second hard mask 51B.

Figure 20:
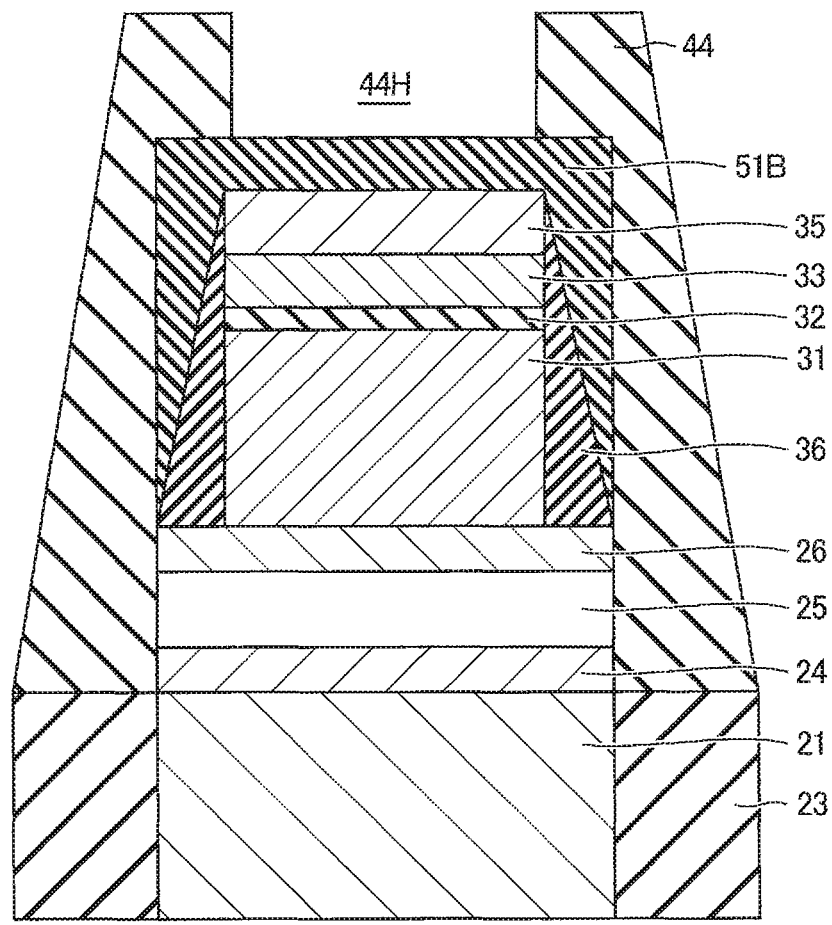

As shown in FIG. 20, a mask (not shown) which has an opening above a region in which a conductor 22 is to be formed is formed on the top surface of the insulator 44. An opening 44H is formed in the region in the insulator 44 in which the conductor 22 is to be formed, by anisotropic etching, such as RIE, using the mask. The insulator 44 and the second hard mask 51 have different etching rates for the etching in FIG. 20. Therefore, the formation of the opening 44H stops when the opening has reached the second hard mask 51B.

Figure 21:
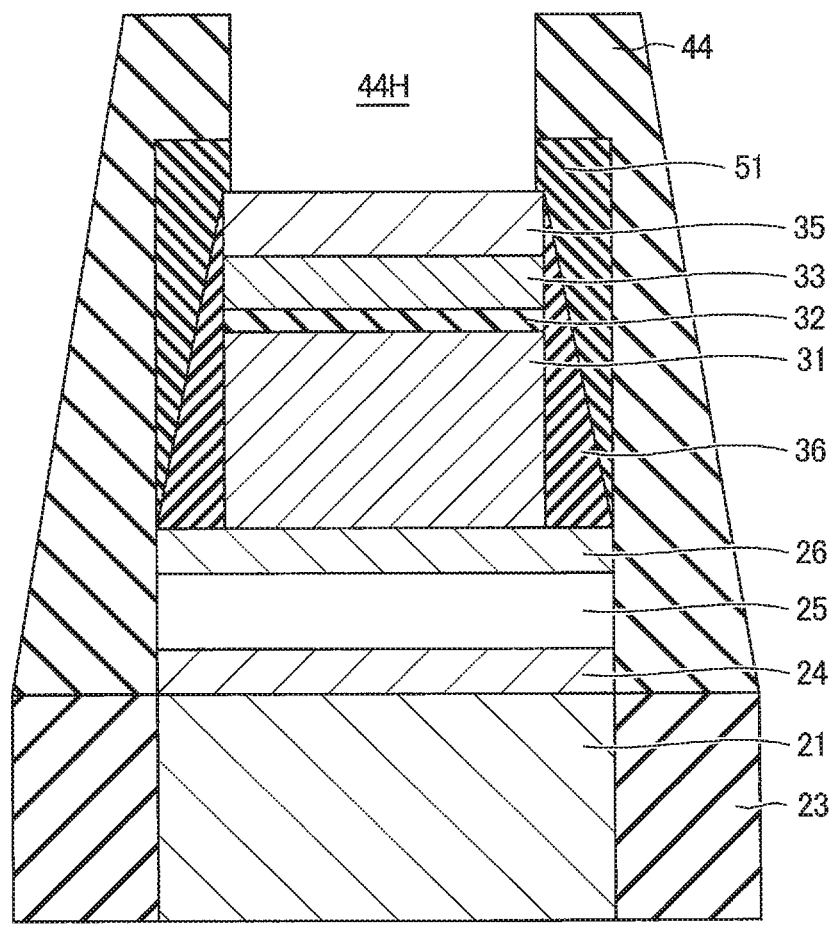

As shown in FIG. 21, a region of the second hard mask 51B below the opening 44H is removed by etching under conditions which are distinct from those of the etching in FIG. 20. The second hard mask 51B has an etching rate different, for the etching in FIG. 21, than those of the insulator 44 and side-wall insulator 36. Therefore, an upper portion of the second hard mask 51B is removed by the etching, and thereby the second hard mask 51B becomes the second hard mask 51, and the bottom of the opening 44H reaches the top surface of the first hard mask 35. In the etching of the second hard mask 51B, the insulator 44 can function as a mask. Next, as shown in FIG. 14, the opening 44H is filled with the conductor 22.

2.3. Advantages

According to the second embodiment, it is possible to provide a magnetoresistive memory device 1 including memory cells MC that can be highly densely arranged as described below.

FIG. 22 shows a structure of a magnetoresistive memory device for reference and shows a cross section corresponding to FIG. 16. An insulator 144, a conductor 122, and a side-wall insulator 136 in FIG. 22 are components corresponding to the insulator 44, conductor 22, and side-wall insulator 36 of the second embodiment shown in FIG. 16, respectively.

In order to provide memory cells highly densely, it is desired that the dimensions of each component of the memory cells be smaller and/or that the intervals of the memory cells be narrower much possible. With such smaller components and/or narrower interval between the memory cells, misalignment of a mask easily occurs in the lithography process and the etching in the course of the manufacturing of memory cells. The center of the insulator 44 in the x-y plane desirably coincides with the center the conductor 22 in the x-y plane as much as possible, as is the case shown in FIG. 16. However, a mask for forming an opening (corresponding to the opening 44H in FIG. 21) for the conductor 122 in the insulator 144 may be more largely misaligned than an intended position. As a result, a contact area between the conductor 122 and the top surface of the first hard mask 35 is smaller than an intended size as shown in FIG. 22. Therefore, the resistance between the conductor 122 and the top surface of the first hard mask 35 is high, similarly to that described with reference to FIG. 15 of the first embodiment.

In addition, the side-wall insulator 136 is etched the step of forming the opening for the conductor 122 in the insulator 144, and the side surfaces of a ferromagnetic layer 33, an insulating layer 32, and/or a ferromagnetic layer 31 suffer damage. This may deteriorate magnetic properties of the ferromagnetic layer 33, insulating layer 32, and/or the ferromagnetic layer 31, and thus memory cells MCBR including these layers.

Furthermore, if the opening for the conductor 122 in the insulator 144 reaches the side wall of the ferromagnetic layer 31, the conductor 122 buried in the opening may cause a short-circuit between the ferromagnetic layers 33 and 31 as shown on the right-hand side of FIG. 22. The memory cell MCBR including the short-circuited ferromagnetic layers 33 and 31 can no longer function as a memory cell. Moreover, the opening for the conductor 122 in the insulator 144 may even reach the conductor 1 as shown on the right-hand side of FIG. 22. In this case, the memory cell MCBR cannot function as a memory cell either.

Figure 23:
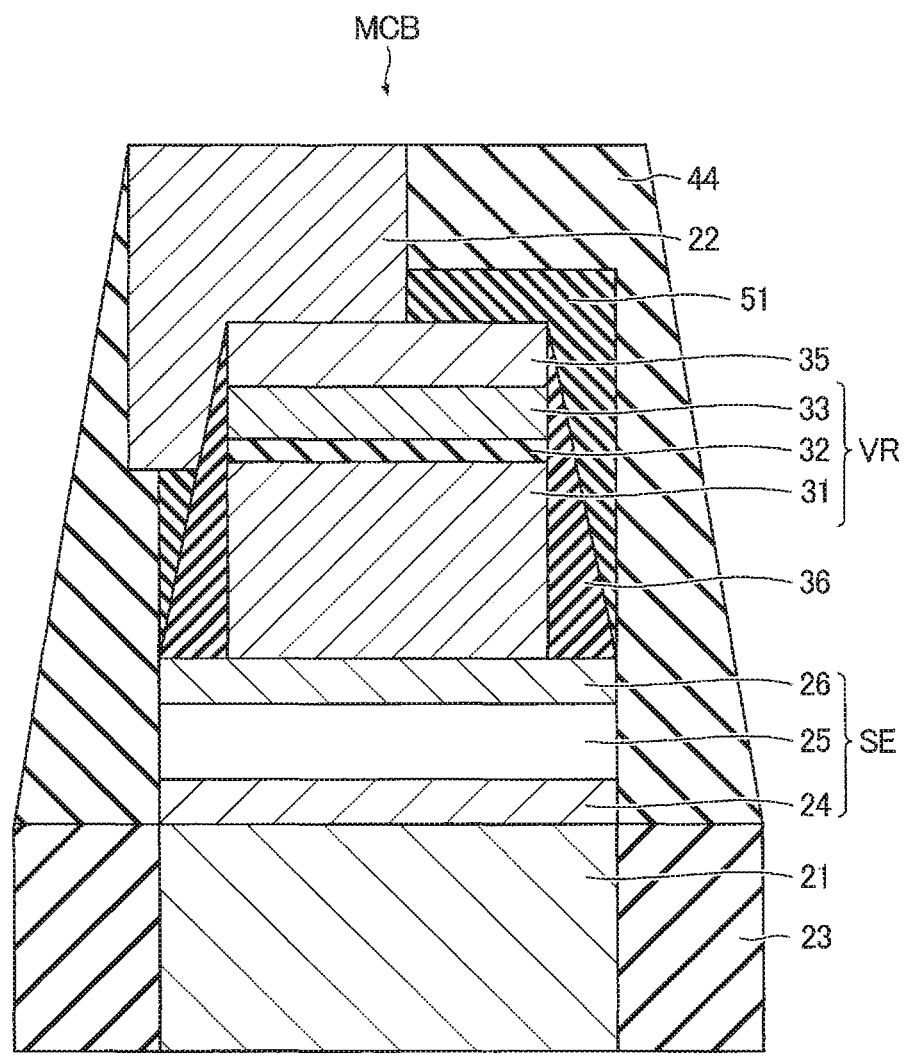
FIG. 23 shows another structure of the magnetoresistive memory device according to the second embodiment.
Figure 23:
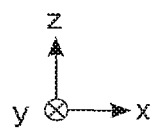

According to the second embodiment, the second hard mask 51 is provided between the first hard mask 35 and the conductor 22. The second hard mask 51 includes or is made of a material which is etched at an etching rate that is different than those of the insulator 44 and side-wall insulator 36 for various types of etching. Therefore, the etching of the insulator 44 does not etch the second hard mask 51B at all or hardly etches it. Therefore, even if the opening of the mask for forming the opening 44H is largely misaligned from the region above the first hard mask 35, the side-wall insulator 36 is protected from the etching for forming the opening 44H. On the other hand, the side-wall insulator 36 is protected from the etching against the second hard mask 51B shown in FIG. 21. Even if the opening of the mask for forming the opening 44H is largely misaligned from the region above the first hard mask 35, the interposition of the side-wall insulator 36 suppress or prevents the conductor 22 buried in the opening 44H from contacting the side wall of the memory cell MC, the side wall of the switching element SE and/or the conductor 22, as shown in FIG. 23. Therefore, it is possible to form a memory cell MC that operates even if the dimensions of the components of the memory cell MC are small and/or the intervals of memory cells MC are narrow, which allows the memory cells MC that operate normally to be arranged highly densely.

2.4. Modifications

The insulator 44 and the side-wall insulator 36 may include or be made of a silicon, oxide, and the second hard mask 51 may include or be made of a silicon nitride. In this case, the formation of the insulator 44 can be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
   a first conductor;
   a layer stack including a first ferromagnetic layer, a second ferromagnetic layer, and an insulating layer between the first ferromagnetic layer and the second ferromagnetic layer and having a first surface in contact with the first conductor;
   an insulator on a side surface of the layer stack;
   a second conductor on a second surface of the layer stack, the second surface being at an opposite side of the first surface;
   a third conductor having a first portion on the second conductor and a second portion on a side surface of the insulator, at least a part of the insulator being positioned in an area sandwiched by the layer stack and the second portion; and
   a fourth conductor on the third conductor.

2. The device of claim 1, wherein the third conductor covers a top surface of the second conductor.

3. The device of claim 1, wherein a side surface of the first conductor is positioned further toward a center of the device than a lower end of the side surface of the insulator or a lower end of a side surface of the third conductor.

4. The device of claim 1, wherein the third conductor includes at least one of scandium (Sc), titanium (Ti), yttrium (Y), zirconium (Zr), niobium (Nb), molybdenum (Mo), ruthenium (Ru), hafnium (Hf), tantalum (Ta), and tungsten (W); nitrides of Sc, Ti, Y, Zr, Nb, Mo, Ru, Hf, Ta, and W; and borides of Sc, Ti, Y, Zr, Nb, Mo, Ru, Hf, Ta, and W.

5. The device of claim 1, further comprising:
   a fifth conductor and a variable resistive material on the fifth conductor,
   wherein the first conductor is on the variable resistive material.

6. A magnetoresistive memory device comprising:
   a first conductor;
   a layer stack including a first ferromagnetic layer, a second ferromagnetic layer, and an insulting layer between the first ferromagnetic layer and the second ferromagnetic layer and having a first surface in contact with the first conductor;
   a first insulator on a side surface of the layer stack, the first insulator having an outer side surface opposite an inner side surface thereof facing the layer stack;
   a second conductor on a second surface of the layer stack, the second surface being at an opposite side of the first surface;
   a second insulator comprising a material different from a material of the first insulator, the second insulator including a portion on the outer side surface of the first insulator, and further including a first opening that reaches the second conductor above the second conductor;
   a third insulator including a portion above the second insulator and including a second opening connected to the first opening; and
   a third conductor provided in the first and second openings and being in contact with the second conductor.

7. The device of claim 6, wherein the second insulator is made of a material which is etched at an etching rate that is different than an etching rate of the first insulator and an etching rate of the third insulator.

8. The device of claim 6, wherein the first insulator and the third insulator comprise one of a silicon nitride and a silicon oxide, and the second insulator comprises the other of the silicon nitride and the silicon oxide.

9. The device of claim 6, wherein a side surface of the first conductor is positioned further toward a center of the device than a lower end of the outer side surface of the first insulator or a lower end of a side surface of the second insulator.

10. The device of claim 6, further comprising:
a fourth conductor and a variable resistive material on the fourth conductor,
wherein the first conductor is on the variable resistive material.

11. A magnetoresistive memory device comprising:
a first conductor;
a layer stack including a first ferromagnetic layer, a second ferromagnetic layer, and an insulating layer between the first ferromagnetic layer and the second ferromagnetic layer and having a first surface in contact with the first conductor;
an insulator on a side surface of the layer stack;
a second conductor on a second surface of the layer stack, the second surface being at an opposite side of the first surface;
a third conductor having a portion on the second conductor and a portion on a side surface of the insulator;
a fourth conductor on the third conductor;
a fifth conductor; and
a variable resistive material on the fifth conductor,
wherein the first conductor is on the variable resistive material.

12. The device of claim 11, wherein the third conductor covers a top surface of the second conductor.

13. The device of claim 11, wherein a side surface of the first conductor is positioned further toward a center of the device than a lower end of the side surface of the insulator or a lower end of a side surface of the third conductor.

14. The device of claim 11, wherein the third conductor includes at least one of scandium (Sc), titanium (Ti), yttrium (Y), zirconium (Zr), niobium (Nb), molybdenum (Mo), ruthenium (Ru), hafnium (Hf), tantalum (Ta), and tungsten (W); nitrides of Sc, Ti, Y, Zr, Nb, Mo, Ru, Hf, Ta, and W; and borides of Sc, Ti, Y, Zr, Nb, Mo, Ru, Hf, Ta, and W.

* * * * *